US010748934B2

(12) United States Patent
Liang et al.

(10) Patent No.: US 10,748,934 B2
(45) Date of Patent: Aug. 18, 2020

(54) SILICON ON INSULATOR WITH MULTIPLE SEMICONDUCTOR THICKNESSES USING LAYER TRANSFER

(71) Applicant: QUALCOMM Incorporated, San Diego, CA (US)

(72) Inventors: Qingqing Liang, San Diego, CA (US); Stephen Alan Fanelli, San Marcos, CA (US); Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/115,352

(22) Filed: Aug. 28, 2018

(65) Prior Publication Data

US 2020/0075633 A1    Mar. 5, 2020

(51) Int. Cl.
| H01L 27/12 | (2006.01) |
| H01L 21/02 | (2006.01) |
| H01L 21/28 | (2006.01) |
| H01L 21/8238 | (2006.01) |
| H01L 21/84 | (2006.01) |
| H01L 29/06 | (2006.01) |
| H01L 29/51 | (2006.01) |

(52) U.S. Cl.
CPC .... *H01L 27/1203* (2013.01); *H01L 21/02532* (2013.01); *H01L 21/28194* (2013.01); *H01L 21/823857* (2013.01); *H01L 21/84* (2013.01); *H01L 29/0653* (2013.01); *H01L 29/517* (2013.01)

(58) Field of Classification Search
CPC ...................... H01L 27/1203; H01L 21/02532

USPC .......................................................... 257/347
See application file for complete search history.

(56) References Cited

U.S. PATENT DOCUMENTS

| 5,364,800 A | 11/1994 | Joyner |
| 6,063,652 A * | 5/2000 | Kim ........................ H01L 21/84 257/347 |
| 6,476,445 B1 * | 11/2002 | Brown .............. H01L 21/76232 257/347 |
| 6,492,209 B1 | 12/2002 | Krishnan et al. |

(Continued)

FOREIGN PATENT DOCUMENTS

| DE | 19732237 A1 | 7/1998 |
| JP | H04323851 A | 11/1992 |

(Continued)

OTHER PUBLICATIONS

International Search Report and Written Opinion—PCT/US2019/044259—ISA/EPO—dated Nov. 7, 2013.

*Primary Examiner* — Igwe U Anya
(74) *Attorney, Agent, or Firm* — Seyfarth Shaw LLP

(57) ABSTRACT

An integrated circuit device includes a portion of a support wafer (e.g., a handle wafer), silicon on insulator layer, a first active device, and a second active device. The first active device has a first semiconductor thickness in a dielectric layer (e.g., a buried oxide layer). The first active device is on the SOI layer. The second active device has a second semiconductor thickness in the same dielectric layer as the first active device. The supporting wafer supports the first active device and the second active device. The second active device is also on the SOI layer. The first and second thicknesses are different from one another.

18 Claims, 31 Drawing Sheets

(56) References Cited

U.S. PATENT DOCUMENTS

| | | | |
|---|---|---|---|
| 6,764,917 B1 | 7/2004 | Chan et al. | |
| 7,173,309 B2 | 2/2007 | Chien | |
| 7,776,722 B2* | 8/2010 | Ohnuma | H01L 21/76254 438/475 |
| 9,368,499 B2 | 6/2016 | Hong et al. | |
| 9,391,076 B1 | 7/2016 | Thompson et al. | |
| 9,406,567 B1 | 8/2016 | Shifren et al. | |
| 2006/0091427 A1* | 5/2006 | Waite | H01L 21/84 257/213 |
| 2006/0163743 A1* | 7/2006 | Kuwabara | H01L 21/288 257/773 |
| 2007/0281436 A1* | 12/2007 | Sadaka | H01L 21/82380 438/400 |
| 2008/0286953 A1* | 11/2008 | Ohnuma | H01L 21/76254 438/518 |
| 2009/0140338 A1* | 6/2009 | Gauthier, Jr. | H01L 21/26533 257/350 |
| 2009/0194842 A1 | 8/2009 | Ohara | |
| 2010/0025853 A1* | 2/2010 | Lindgren | G06F 17/5068 257/763 |
| 2010/0140708 A1 | 6/2010 | Hill et al. | |
| 2012/0228711 A1 | 9/2012 | Hoshino | |
| 2014/0367777 A1 | 12/2014 | Huang et al. | |
| 2016/0103278 A1* | 4/2016 | Cheng | H01S 5/026 385/14 |
| 2016/0105247 A1* | 4/2016 | Cheng | H01L 31/173 250/551 |
| 2017/0194194 A1* | 7/2017 | Tsai | H01L 21/76251 |
| 2017/0373026 A1 | 12/2017 | Goktepeli | |
| 2019/0221472 A1* | 7/2019 | Kouassi | H01L 21/76224 |

FOREIGN PATENT DOCUMENTS

| | | |
|---|---|---|
| JP | 2001274234 A | 10/2001 |
| JP | 2002026137 A | 1/2002 |

* cited by examiner

SILICON ON INSULATOR WITH MULTIPLE SEMICONDUCTOR THICKNESSES USING LAYER TRANSFER

TECHNICAL FIELD

The present disclosure generally relates to integrated circuits (ICs). More specifically, the present disclosure relates to layered silicon-insulator-silicon substrates with multiple semiconductor thicknesses, achieved with a layer transfer process.

BACKGROUND

Mobile radio frequency (RF) chip designs (e.g., mobile RF transceivers), including high performance diplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communications enhancements, such as carrier aggregation. Further design challenges for mobile RF transceivers include analog/RF performance considerations, including mismatch, noise, and other performance considerations. The design of these mobile RF transceivers includes the use of additional passive devices, for example, to suppress resonance, and/or to perform filtering, bypassing, and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), and epitaxy.

SUMMARY

An integrated circuit device includes a portion of a support carrier. The integrated circuit device also includes an SOI layer (silicon on insulator layer). The integrated circuit device also includes a first active device having a first semiconductor thickness in a dielectric layer. The first active device is on the SOI layer. The integrated circuit device further includes a second active device having a second semiconductor thickness in the dielectric layer. The support carrier supports the first active device and the second active device. The second active device is also on the SOI layer. The second semiconductor thickness is different from the first semiconductor thickness.

A method of making an integrated circuit device includes fabricating a portion of a support carrier. The method also includes fabricating an SOI layer (silicon on insulator layer). The method further includes fabricating a first active device having a first semiconductor thickness in a dielectric layer. The first active device is on the SOI layer. Furthermore, the method includes fabricating a second active device having a second semiconductor thickness in the dielectric layer. The support carrier supports the first active device and the second active device. The second active device is also on the SOI layer. The second semiconductor thickness is different from the first semiconductor thickness.

An integrated circuit device includes a portion of a support carrier. The integrated circuit device also includes an SOI layer (silicon on insulator layer). The integrated circuit device also includes a first means for controlling electron flow having a first semiconductor thickness in a dielectric layer. The first electron flow control means is on the SOI layer. The integrated circuit device further includes a second means for controlling electron flow having a second semiconductor thickness in the dielectric layer. The support carrier supports the first electron flow control means and the second electron flow control means. The second electron flow control means is also on the SOI layer. The second semiconductor thickness is different from the first semiconductor thickness.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
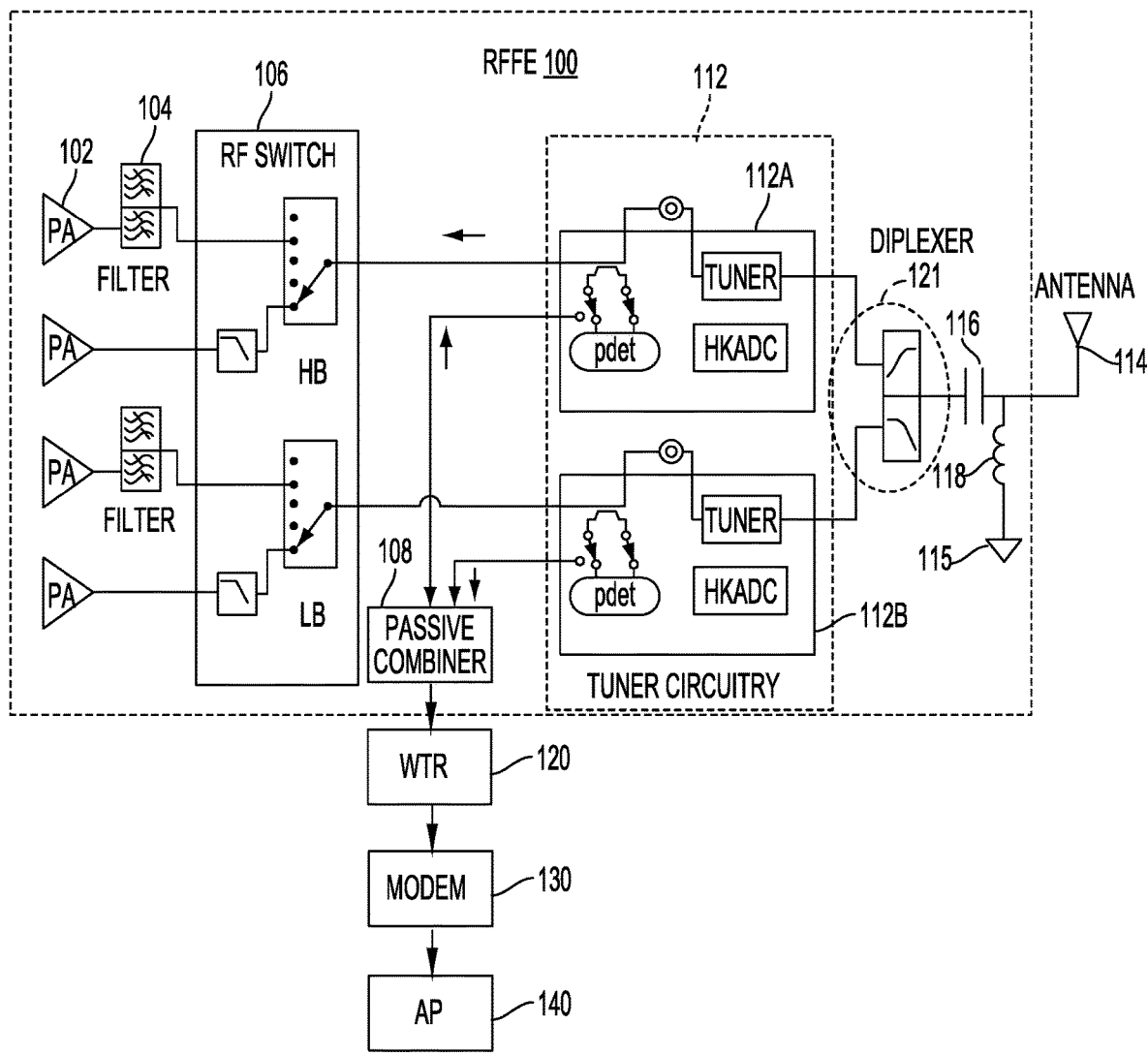
FIG. 1A is a schematic diagram of a radio frequency (RF) front-end (RFFE) module employing a semiconductor device according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communications enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. The process flow for semiconductor fabrication of the integrated circuit structure may include front-end-of-line (FEOL) processes, middle-of-line (MOL) processes, and back-end-of-line (BEOL) processes to form interconnects (e.g., M1, M2, M3, M4, etc.). The front-end-of-line processes may include the set of process steps that form the active devices, such as transistors, capacitors, and diodes. The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to BEOL interconnects. These steps include silicidation and contact formation as well as stress introduction. The back-end-of-line processes may include the set of process steps that form the interconnect that ties the independent transistors and form circuits. Currently, copper and aluminum are used as the interconnects, but with further development of the technology other conductive materials may be used.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced. In addition, the active devices on an SOI layer may include complementary metal oxide semiconductor (CMOS) transistors. For example, complementary metal oxide semiconductor processes may form electronic devices, such as transistors, on a buried oxide (BOX) layer.

In semiconductor devices, a different silicon thickness (Tsi) is preferred for different applications. For example, a thinner silicon thickness is preferred for high-speed/high-density digital/radio frequency (RF) complementary metal oxide semiconductor devices. On the other hand, a thicker silicon thickness (Tsi) is preferred for power and bipolar device applications (e.g. bipolar CMOS diffusion MOS (DMOS)). Furthermore, an even thicker silicon thickness is preferred for photo sensor/photo voltaic (PV) devices. However, it is very difficult to integrate active devices with different silicon thicknesses on a same wafer. Normally, these devices are generally assembled at a system level.

Aspects of the present disclosure are directed to integrating devices with multiple silicon thicknesses on the same wafer, by adopting a layer-transfer (LT) technique. This layer transfer technique is compatible with current LT technology and thus enables high-density digital, radio frequency, bipolar CMOS diffusion MOS (DMOS), and photo sensor devices in a same wafer/die, which can significantly save cost and area.

Aspects of the present disclosure are directed to an integrated circuit device with multiple active devices having different semiconductor (e.g., silicon) thicknesses on a same wafer. In one aspect of the present disclosure, the integrated circuit device includes a portion of a support wafer (e.g., a handle wafer), silicon on insulator, a first active device, and a second active device. The first active device has a first semiconductor thickness in a dielectric layer (e.g., a buried oxide layer). The first device is on the SOI layer. The second active device has a second semiconductor thickness in the same dielectric layer as the first active device. The supporting wafer supports the first active device and the second active device. The second active device is also on the SOI layer. The first and second thicknesses ae different from one another.

Although aspects of the present disclosure are described with respect to silicon on insulator technology, the aspects of the disclosure can also be implemented using other fabrication technologies for a planar transistor, a fin-type field effect transistor (FinFET), a nanotube, a bulk silicon alternative to the silicon on insulator technology, or other like semiconductor fabrication technology. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably unless such interchanging would tax credulity.

FIG. 1A is a schematic diagram of a radio frequency (RF) front-end (RFFE) module 100 employing a semiconductor device (e.g., a diplexer 121) according to an aspect of the present disclosure. Although a diplexer is described here, other semiconductor devices may be applicable. For example, the semiconductor devices may be based on the integrated circuit device described in accordance with aspects of the present disclosure. The RF front-end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front-end module 100.

The RF front-end module 100 also includes tuner circuitry 112 (e.g., first tuner circuitry 112A and second tuner circuitry 112B), the diplexer 121, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog-to-digital converter (HKADC). The tuner circuitry 112 may perform impedance tuning (e.g., a voltage standing wave ratio (VSWR) optimization) for the antenna 114. The RF front-end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 121 is between the tuner component of the tuner circuitry 112 and the capacitor 116, the inductor 118, and the antenna 114. The diplexer 121 may be placed between the antenna 114 and the tuner circuitry 112 to provide high system performance from the RF front-end module 100 to a chipset including the wireless transceiver 120, the modem 130, and the application processor 140. The diplexer 121 also performs frequency domain multiplexing on both high band frequencies and low band frequencies. After the diplexer 121 performs its frequency multiplexing functions on the input signals, the output of the diplexer 121 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
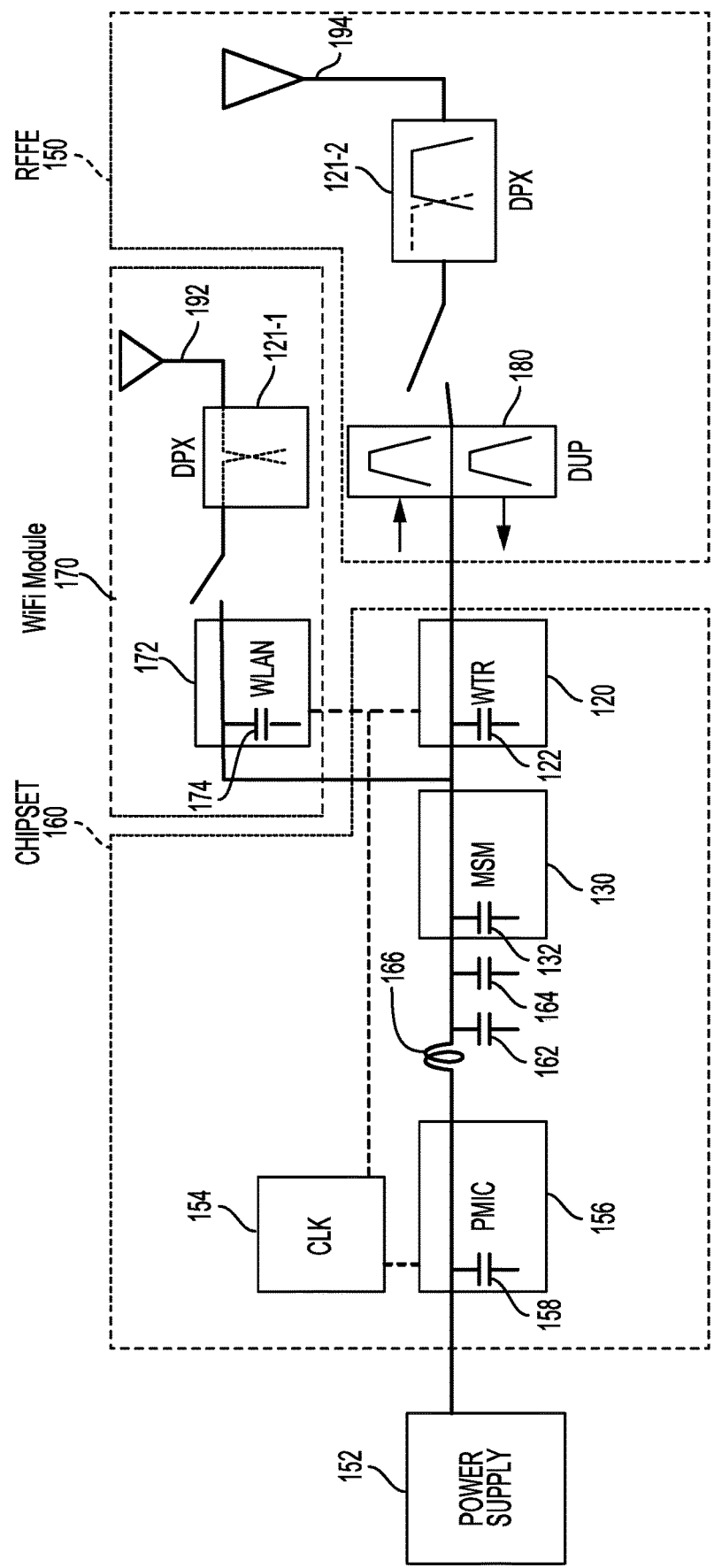
FIG. 1B is a schematic diagram of a radio frequency (RF) front-end (RFFE) module employing semiconductor devices for a chipset to provide carrier aggregation according to aspects of the present disclosure.

FIG. 1B is a schematic diagram of a wireless local area network (WLAN) (e.g., WiFi) module 170 including a first diplexer 121-1 and an RF front-end module 150 including a second diplexer 121-2 for a chipset 160 to provide carrier aggregation according to an aspect of the present disclosure. The WiFi module 170 includes the first diplexer 121-1 communicably coupling an antenna 192 to a wireless local area network module (e.g., WLAN module 172). The RF front-end module 150 includes the second diplexer 121-2-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
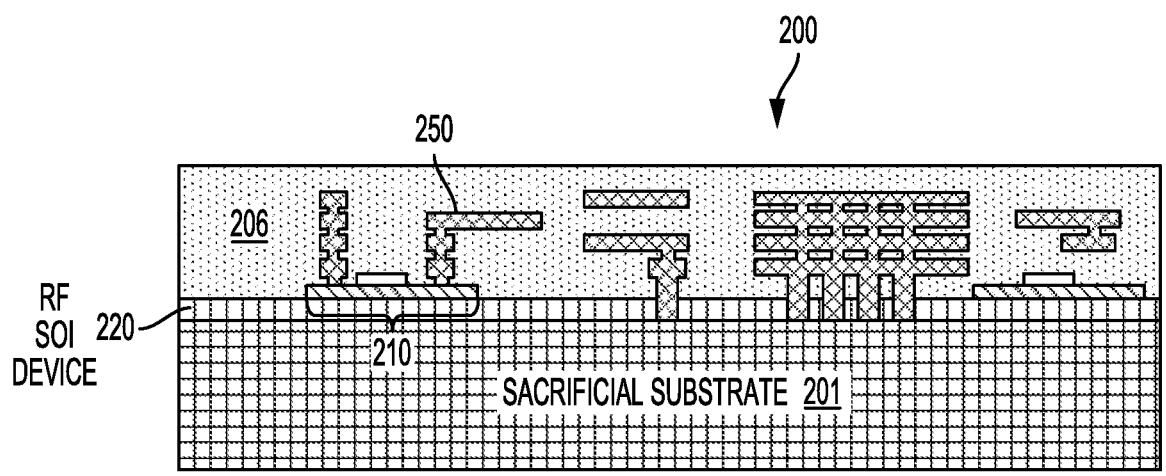
FIGS. 2A to 2D show cross-sectional views of an integrated radio frequency (RF) circuit structure during a layer transfer process.
Figure 2B:
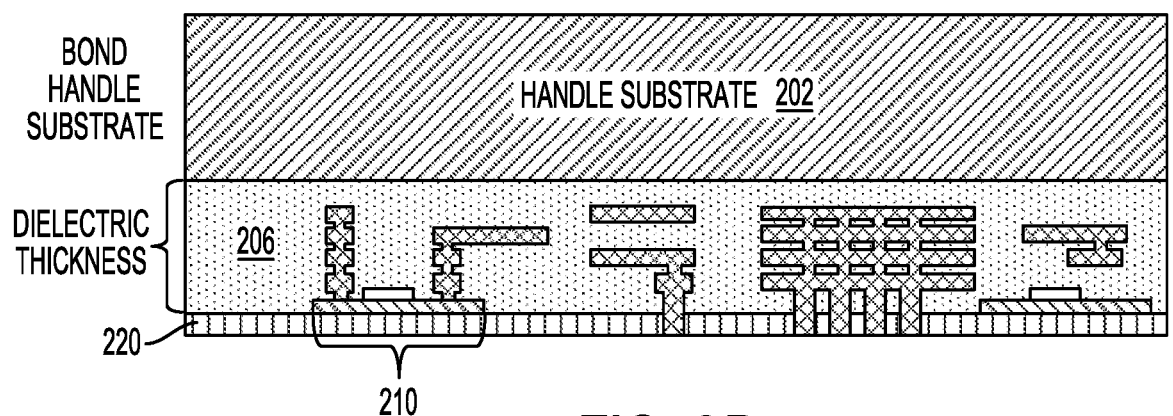

FIGS. 2A to 2D show cross-sectional views of an integrated radio frequency (RF) circuit structure 200 during a layer transfer process according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a front-side dielectric layer 206. As shown in FIG. 2B, a handle substrate 202 is bonded to the front-side dielectric layer 206 of the RF SOI device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is inversely proportional to the dielectric thickness, which determines the distance between the active device 210 and the handle substrate 202.

Figure 2C:
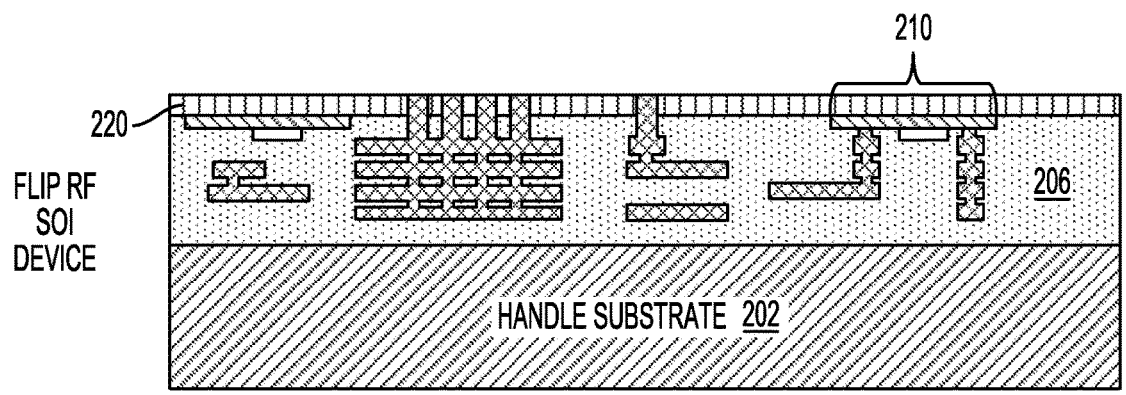
Figure 2D:
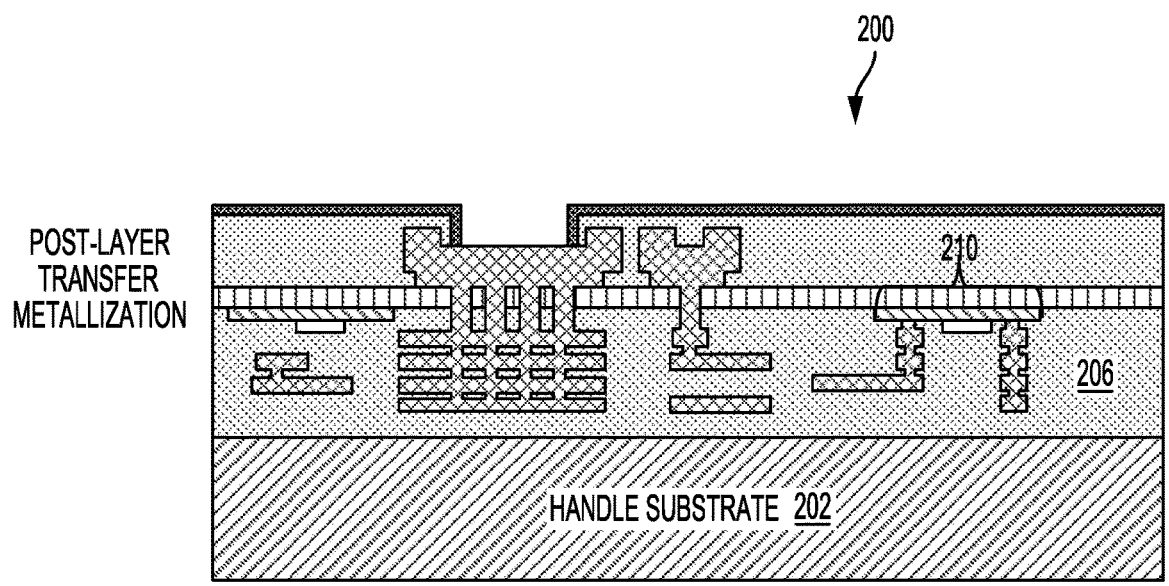

As shown in FIG. 2C, the RF SOI device is flipped once the handle substrate 202 is secured and the sacrificial substrate 201 are removed. As shown in FIG. 2D, a post layer transfer metallization process is performed using, for example, a regular complementary metal-oxide-semiconductor (CMOS) process. The integrated RF circuit structure 200 may be completed by depositing a passivation layer, opening bond pads, depositing a redistribution layer, and forming conductive bumps/pillars to enable bonding of the integrated RF circuit structure 200 to a system board (e.g., a printed circuit board (PCB)).

Aspects of the present disclosure are directed to an integrated circuit device with multiple active devices having different semiconductor (e.g., silicon) thicknesses on a same wafer, as shown in FIGS. 3, 4A-4E, 5A-5D, 6, 7A-7F, 8, and 9A-9F.

Figure 3:
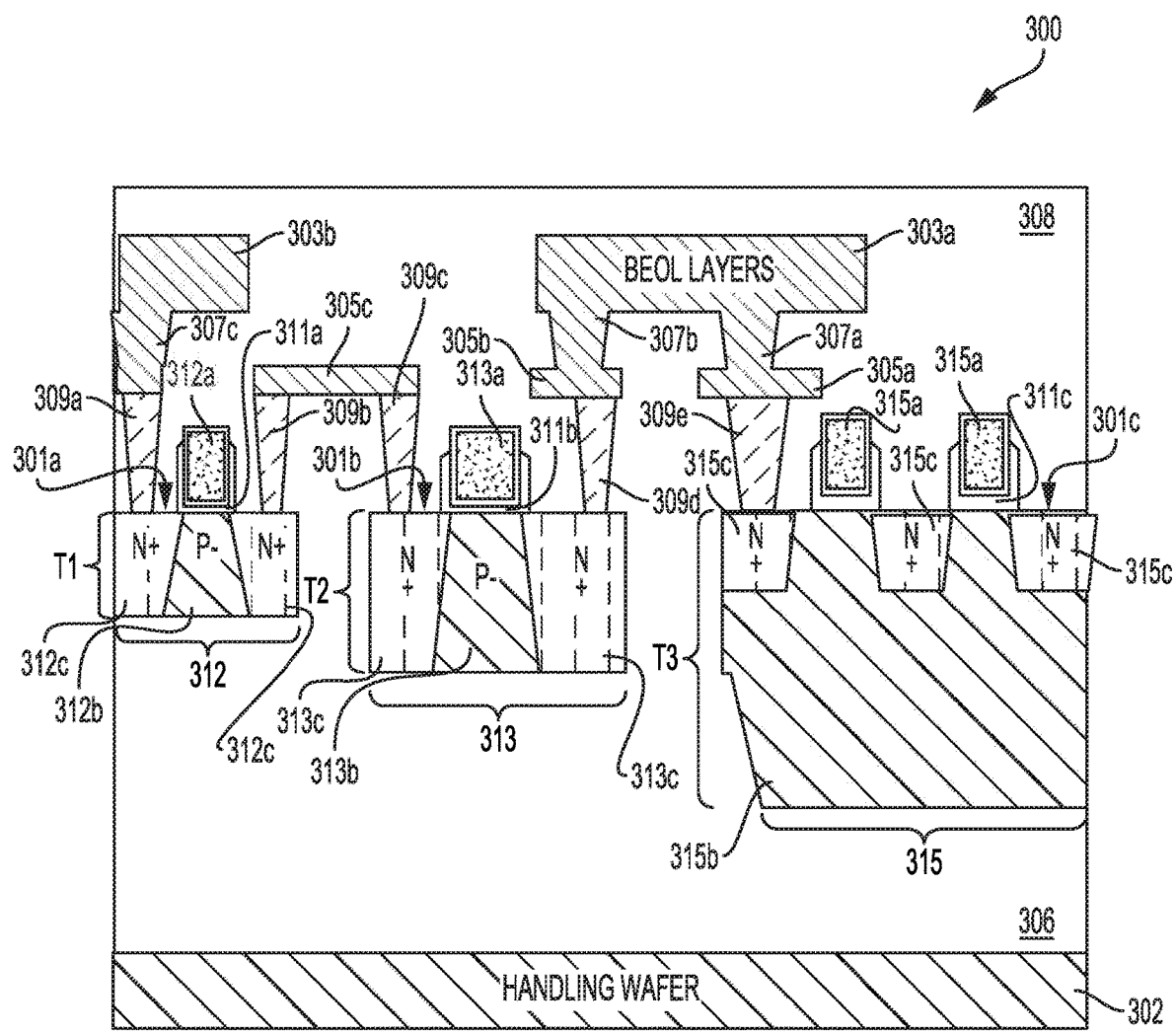
FIG. 3 is a cross-sectional view of an integrated radio frequency (RF) circuit structure with multiple semiconductor thicknesses, according to aspects of the present disclosure.

FIG. 3 is a cross-sectional view of an integrated radio frequency (RF) circuit structure 300 with multiple semiconductor thicknesses, according to aspects of the present disclosure. The integrated RF circuit structure 300 includes multiple active devices (e.g., a first active device 312, a second active device 313, and a third active device 315). The first active device 312 includes a gate 312a, a body 312b, and source/drain regions 312c formed on an isolation layer 306. The second active device 313 includes a gate 313a, a body 313b, and source/drain regions 313c formed on the isolation layer 306. The third active device 315 includes one or more gates 315a, a body 315b, and source/drain regions 315c formed on the isolation layer 306. In some aspects, the thicknesses of the gates 312a, 313a, and 315a the same. In other aspects, the thicknesses of the gates 312a, 313a, and 315a are different. In silicon on insulator (SOI) implementations, the isolation layer 306 is a buried oxide (BOX) layer, and the body and source/drain regions 312c, 313c, and 315c are formed from an SOI layer including shallow trench isolation (STI) regions supported by the BOX layer.

The integrated RF circuit structure 300 also includes middle-of-line (MOL)/back-end-of-line (BEOL) interconnects coupled to the source/drain regions of the active devices. The active devices are coupled to conductive structures (e.g., contacts, pads, vias, interconnects, etc.) that enable other devices to be coupled to the semiconductor devices. For example, the first active device 312 is coupled to vias 309a, 309b, and 307c as well as to interconnects 303b and 305c. The second active device 313 is coupled to vias 309c, 309d, and 307b as well as to interconnects 305b, 305c, and 303a. The third active device 315 is coupled to vias 309e and 307a as well as to interconnects 303a and 305a.

Layers supporting the isolation layer 306 may be referred to as back-side layers; and opposite layers (e.g., the MOL/BEOL layers described with reference to FIG. 3) are referred to as front-side MOL/BEOL layers. According to this nomenclature, front-side interconnects 303a, 303b, 305a, 305b, and 305c are coupled to the source/drain regions of the active devices through vias 309a, 309b, 309c, 309d, 309e, 307a, 307b, and 307c, and arranged in a front-side dielectric layer 308. In this configuration, a handle substrate or wafer 302 is directly coupled to and supports the isolation layer 306 on the back-side. In some aspects, a back-side dielectric is adjacent to and possibly supports the isolation layer 306. The back-side dielectric may be between the handle wafer 302 and the isolation layer 306.

The multiple active devices have different semiconductor (e.g., silicon) thicknesses on one or more portions of a same wafer. For example, the first active device 312 has a first thickness T1 on the handling/handle wafer/substrate 302. The second active device 313 has a second thickness T2 on the handle wafer 302. The third active device 315 has a third thickness T3 on the handle wafer 302. In this aspect, the third thickness T3 is thicker than the second thickness T2 and the second thickness T2 is thicker than the first thickness T1.

In one aspect of the present disclosure, an integrated circuit device (e.g., the integrated RF circuit structure 300) includes a portion of a support wafer (e.g., a handle wafer 302) and a silicon on insulator (SOI) wafer having portions for forming the active devices. For example, the body 312b, the body 313b, and/or the body 315b and the source/drain regions 312c, 313c, and 315c are formed on an SOI layer having STI regions between the active devices 312, 213, 315. Thus, the first active device 312, the second active device 313, and the third active device 315 are fabricated from the SOI layer. As noted, the first active device 312 has the first semiconductor thickness T1 in a dielectric layer (e.g., the isolation layer 306). The second active device 313 has the second semiconductor thickness T2 in the same dielectric layer as the first active device 312. The third active device 315 has the third semiconductor thickness T3 in the same dielectric layer as the first active device 312. The supporting wafer (e.g., the handle wafer 302) supports the first active device 312, the second active device 313, and the third active device 315.

The first active device 312, the second active device 313, and the third active device 315 are on a same level. For example, a surface 301a of the source/drain regions 312c is on a same level as a surface 301b of the source/drain regions 313c and on a same level as a surface 301c of the source/drain regions 315c. In one aspect of the disclosure, the source/drain regions 312c, 313c, and 315c include N-type regions (e.g., N+) that respectively contact gate dielectrics 311a, 311b, and 311c. The term N-type comes from the negative charge of the electron. In N-type semiconductors, electrons are the majority carriers and holes are the minority carriers. N-type semiconductors are created by doping an intrinsic semiconductor with donor impurities.

In one aspect of the disclosure, the bodies 312b, 313b, and 315b include P-type regions (e.g., P−) that respectively contact gate dielectrics 311a, 311b, and 311c. The term P-type refers to a positive charge of a hole. P-type semiconductors have a larger hole concentration than electron concentration. In P-type semiconductors, holes are the majority carriers and electrons are the minority carriers. P-type semiconductors are created by doping an intrinsic semiconductor with acceptor impurities.

The aspects of the present disclosure integrate devices with multiple silicon thicknesses (Tsi) on the same wafer, by adopting a layer-transfer (LT) technique. This layer transfer technique is compatible with current LT technology and thus enables high-density digital, radio frequency, bipolar CMOS diffusion MOS (DMOS), and photo sensor devices in a same wafer/die, which can significantly save cost and area.

FIGS. 4A, 4B, 4C, 4D, and 4E are exemplary diagrams illustrating stages of a first method of fabricating an integrated radio frequency (RF) circuit structure with multiple semiconductor thicknesses, according to an aspect of the present disclosure. The integrated RF circuit structure may be the integrated RF circuit structure 300 of FIG. 3. For illustrative purposes, some of the labelling and numbering of the devices and features of FIGS. 4A, 4B, 4C, 4D, and 4E are similar to those of FIG. 3.

Figure 4A:
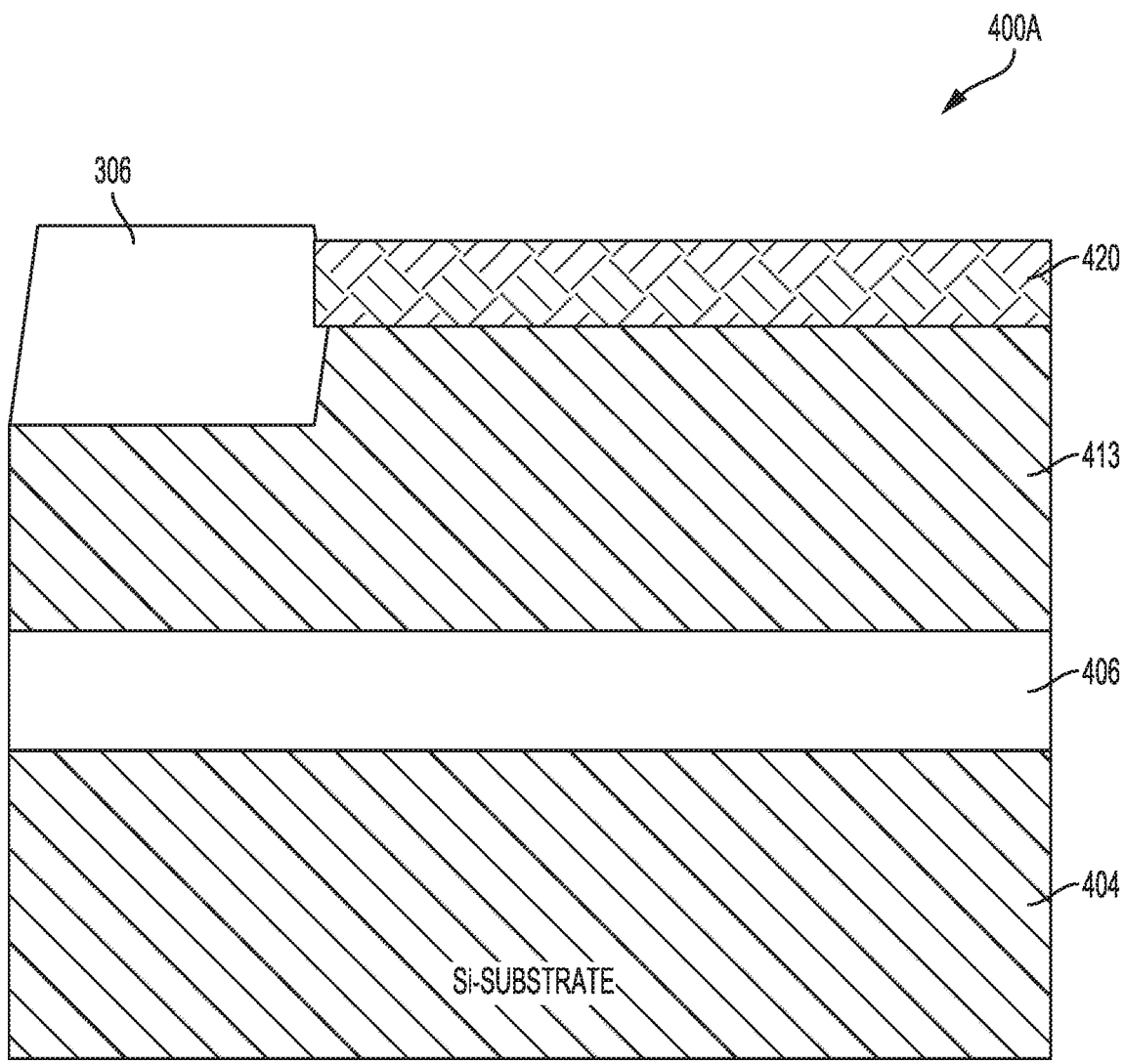
FIGS. 4A, 4B, 4C, 4D, and 4E are exemplary diagrams illustrating stages of a first method of fabricating an integrated radio frequency (RF) circuit structure with multiple semiconductor thicknesses, according to an aspect of the present disclosure.

Referring to FIG. 4A, a first stage of the first method of fabricating the integrated RF circuit structure 300 with multiple semiconductor thicknesses is depicted and generally designated 400A. FIG. 4A illustrates a silicon on insulator (SOI) wafer or SOI layer 413 with a thickness (e.g., the third thickness T3 illustrated in FIG. 3). In some aspects, the SOI layer 413 may be a P-type SOI layer. The SOI layer 413 may be on an isolation layer 406 (e.g., a silicon dioxide (SiO$_2$) isolation layer) and supported by a semiconductor substrate/wafer 404. In some aspects, the semiconductor wafer 404 may be a P-type semiconductor wafer. A hard mask 420 (e.g., a silicon nitride (SiN) hard mask) is used to cover portions of the SOI layer 413 in order to open a region where the first active device 312 (illustrated in FIG. 3) with the first thickness is to be fabricated. Thermal oxidation is then performed to consume the semiconductor (e.g., silicon) of the SOI layer 413. The thermal oxidation results in the formation of an isolation layer (e.g., the isolation 306).

Figure 4B:
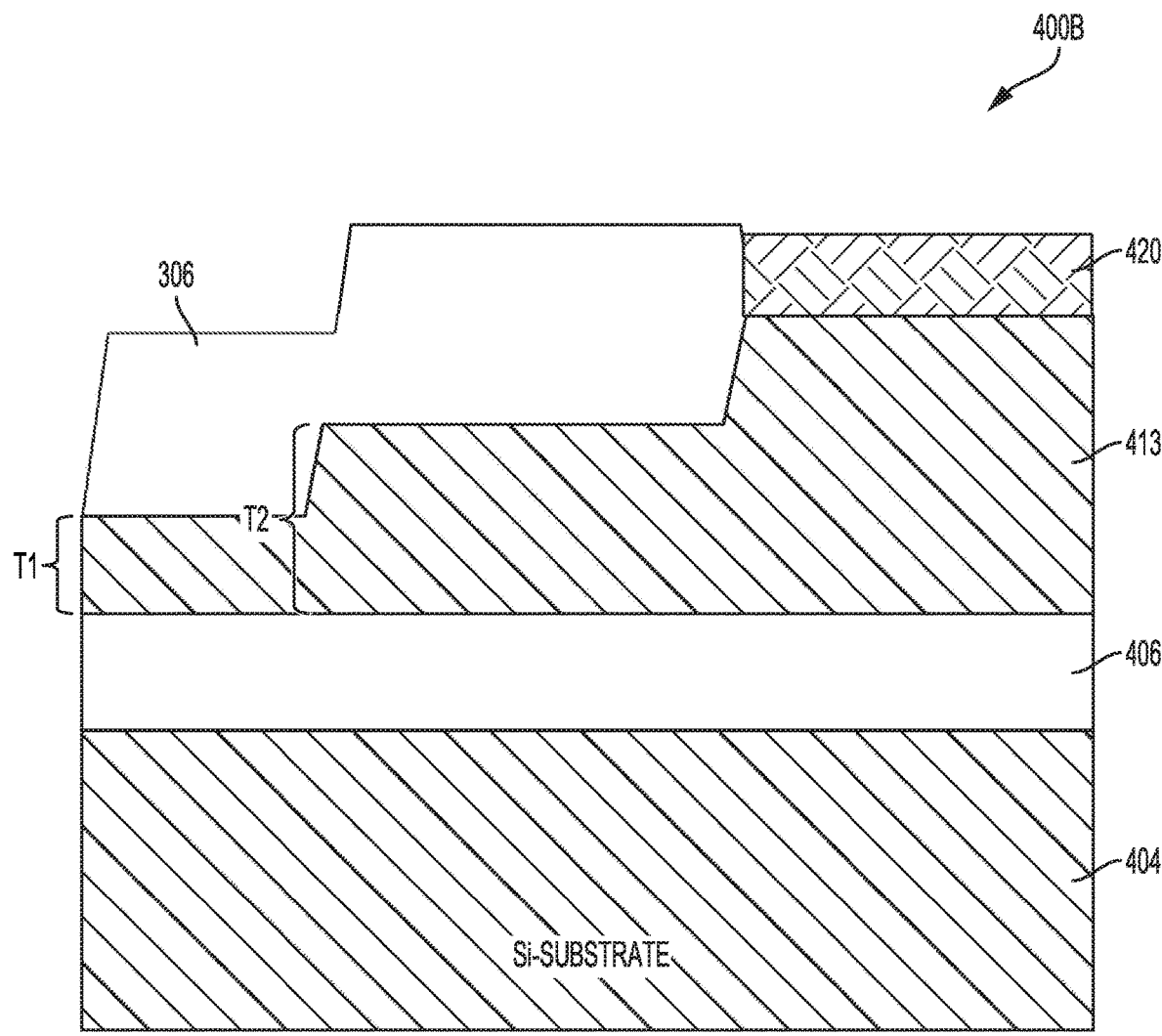

Referring to FIG. 4B, a second stage of the first method of fabricating the integrated RF circuit structure with multiple semiconductor thicknesses is depicted and generally designated 400B. For illustrative purposes, some of the labelling and numbering of the devices and features of FIG. 4B are similar to those of FIG. 4A. The hard mask 420 is used to cover portions of the SOI layer 413 in order to open a region where the second active device 313 (illustrated in FIG. 3) with the second thickness is to be fabricated. FIG. 4B is an illustration of a two-step process. A first step of the two-step process includes selectively etching away the isolation layer 306 (e.g., silicon dioxide layer) illustrated in FIG. 4A. In a second step of the two-step process, thermal oxidation is performed to modify the isolation layer 306 (thereby forming a new isolation layer). The two-step process is performed to open regions where the first thickness T1 and the second thickness T2 are specified. Thermal oxidation is continued to consume more silicon depending on the desirable thickness for the first active device 312 and the second active device 313.

Figure 4C:
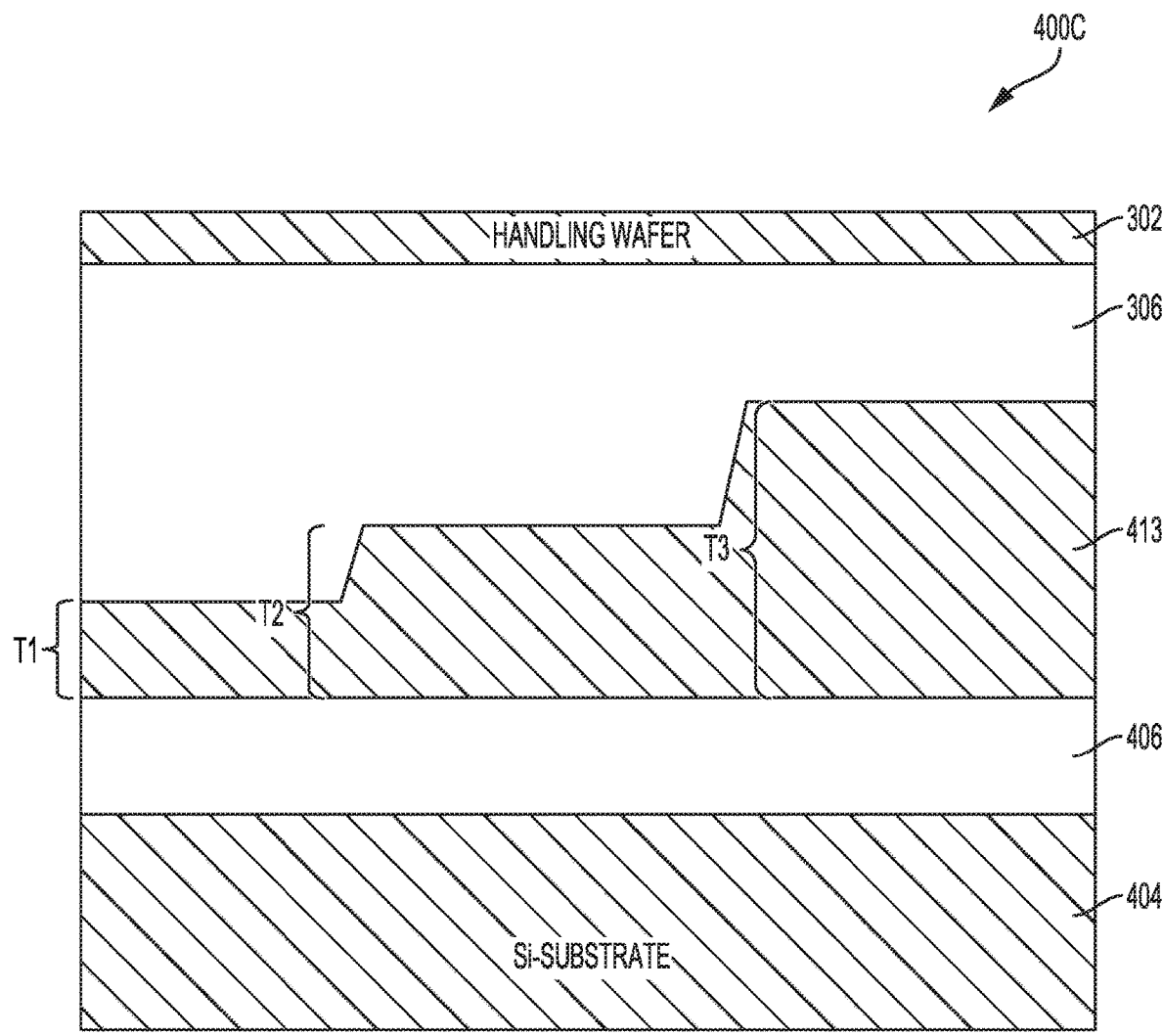

Referring to FIG. 4C, a third stage of the first method of fabricating the integrated RF circuit structure with multiple semiconductor thicknesses is depicted and generally designated 400C. For illustrative purposes, some of the labelling and numbering of the devices and features of FIG. 4C are similar to those of FIGS. 4A and 4B. FIG. 4C illustrates removing the hard mask 420. A thickness of the SOI layer 413 beneath the mask corresponds to the third thickness T3 of the third active device 315 (illustrated in FIG. 3). The removal of the hard mask 420 at this stage, however, may be optional. A bonding material may be deposited on a handling wafer (e.g., the handling wafer 302 illustrated in FIG. 3). In addition, chemical mechanical planarization (CMP) is performed on the isolation layer 306 and then the isolation layer 306 is bonded to the handling wafer 302.

Figure 4D:
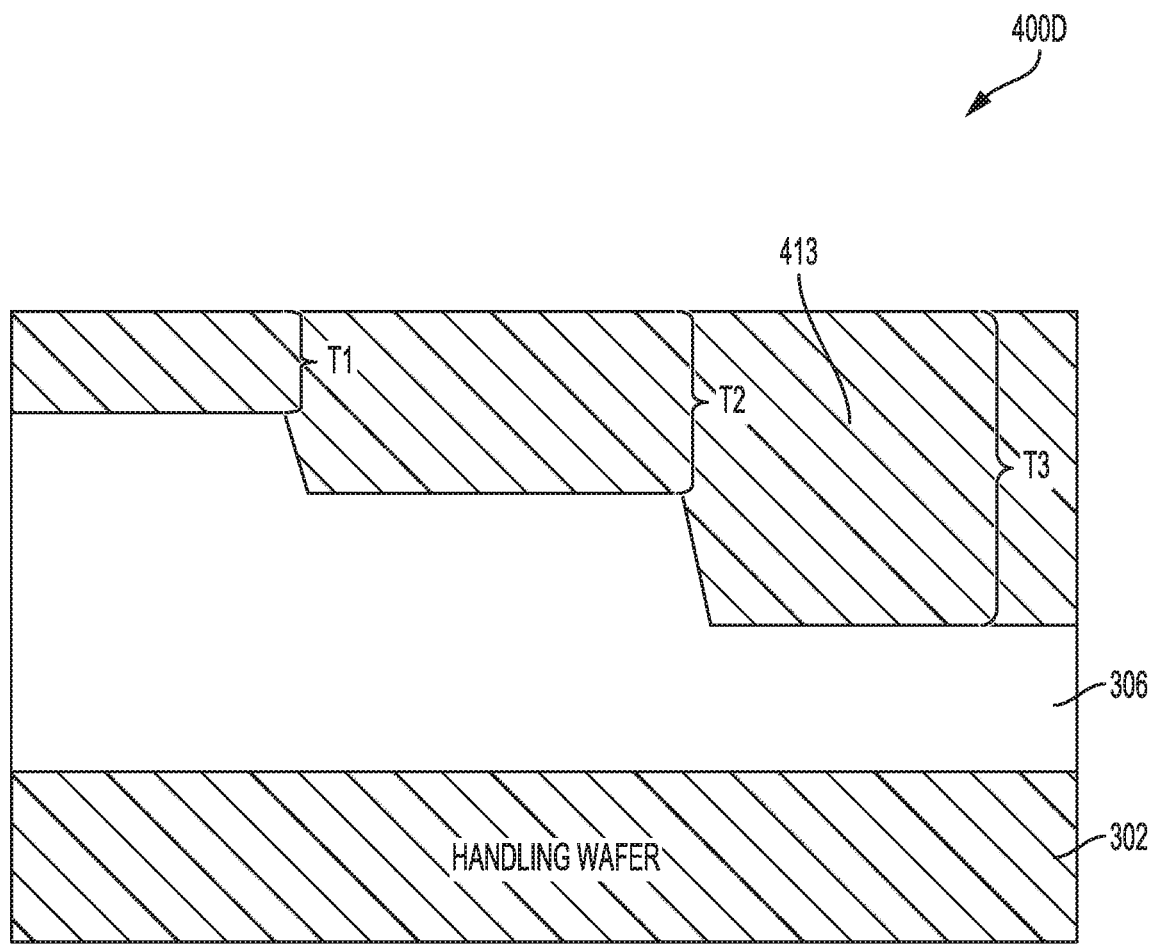

Referring to FIG. 4D, a fourth stage of the first method of fabricating the integrated RF circuit structure with multiple semiconductor thicknesses is depicted and generally designated 400D. For illustrative purposes, some of the labelling and numbering of the devices and features of FIG. 4D are similar to those of FIGS. 4A, 4B, and 4C. FIG. 4D illustrates etching away a back-side silicon substrate (e.g., the semiconductor wafer 404) and etching away the isolation layer 406. In one aspect, the integrated RF circuit structure is flipped before the etching of the semiconductor wafer 404 and the isolation layer 406.

Figure 4E:
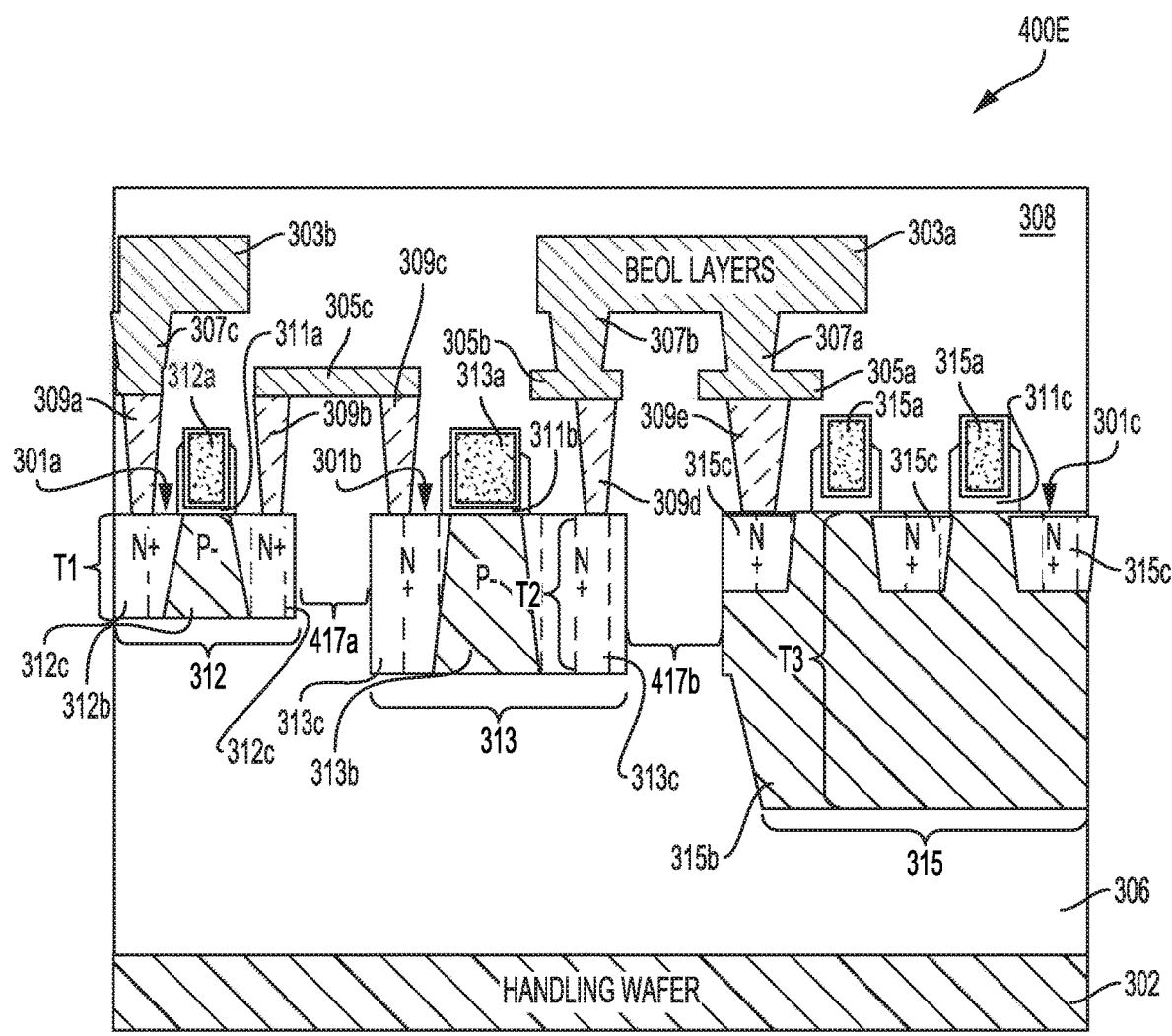

Referring to FIG. 4E, a fifth stage of the first method of fabricating the integrated RF circuit structure 300 with multiple semiconductor thicknesses is depicted and generally designated 400E. For illustrative purposes, some of the labelling and numbering of the devices and features of FIG. 4E are similar to those of FIGS. 3, 4A, 4B, 4C, and 4D. The difference between FIG. 4E and FIG. 3 is that FIG. 4E illustrates a trench insulation (e.g., a first trench insulation region 417a and a second trench insulation region 417b) to separate the active devices having different silicon thicknesses.

Referring to FIG. 4E, the first trench insulation region 417a and the second trench insulation region 417b are formed to separate the active devices with different silicon thicknesses. The formation of the trench insulation regions is then followed by standard FEOL processes to form the active devices and the BEOL processes to form interconnects or conductive structures. For example, following the removal of the semiconductor wafer 404 and the isolation layer 406 as well as the formation of the trench insulation, the active devices (e.g., the first active device 312, the second active device 313, and the third active device 315) and the conductive structures (e.g., contacts, pads, vias, interconnects, etc.) are fabricated. The first active device 312 is fabricated with the SOI layer 413 having the first thickness T1. The source/drain regions 312c are formed by doping the SOI layer 413 having the first thickness T1. The gate 312a and corresponding contact gate dielectric 311a are fabricated on the SOI layer 413 having the first thickness T1.

The second active device 313 is fabricated with the SOI layer 413 having the second thickness T2. For example, the source/drain regions 313c are formed by doping the SOI layer 413 having the second thickness T2 and the gate 313a and corresponding contact gate dielectric 311b are fabricated on the SOI layer 413 having the second thickness T2. The third active device 315 is fabricated with the SOI layer 413 having the third thickness T3. For example, the source/drain regions 315c are formed by doping the SOI layer 413 having the third thickness T3. The gate 315a and corresponding contact gate dielectric 311c are fabricated on the SOI layer 413 having the third thickness T3.

FIGS. 5A, 5B, 5C, and 5D are exemplary diagrams illustrating stages of a second method of fabricating an integrated radio frequency (RF) circuit structure (e.g., the integrated RF circuit structure 300 of FIG. 3) with multiple semiconductor thicknesses, according to an aspect of the present disclosure.

Figure 5A:
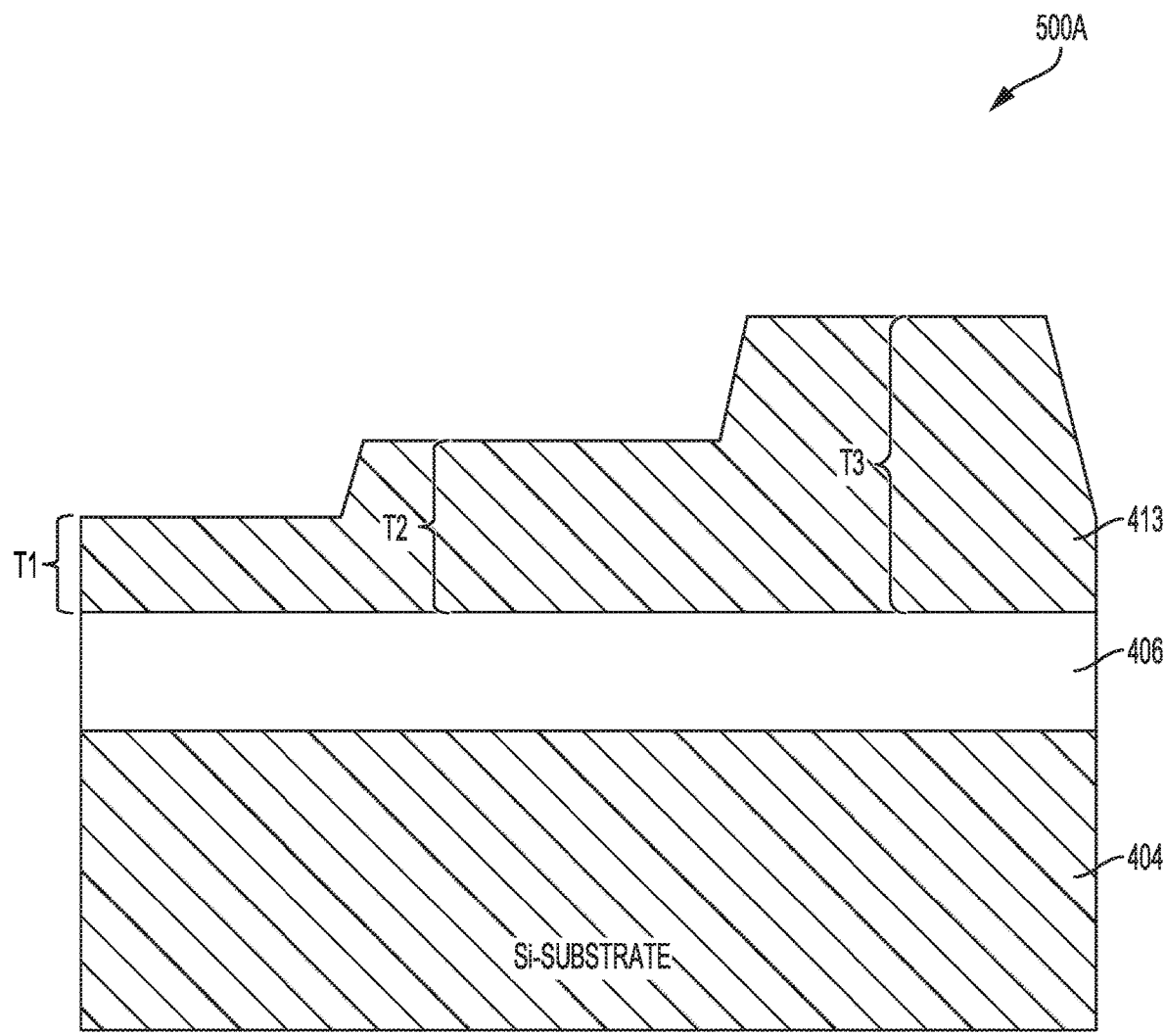
FIGS. 5A, 5B, 5C, and 5D are exemplary diagrams illustrating stages of a second method of fabricating an integrated radio frequency (RF) circuit structure with multiple semiconductor thicknesses, according to an aspect of the present disclosure.

Referring to FIG. 5A, a first stage of the second method of fabricating the integrated RF circuit structure 300 with multiple semiconductor thicknesses is depicted and generally designated 500A. The second method is similar to the first method. However, in the second method, the different thicknesses are formed by selectively performing epitaxy on the SOI layer 413 (as shown in FIG. 5A). For example, starting with a thin SOI layer 413 having the first thickness T1, medium and thick silicon regions may be formed by selectively performing epitaxy. The medium silicon region corresponds to the SOI layer 413 having the second thickness T2. The thick silicon region corresponds to the SOI layer 413 having the third thickness T3.

Figure 5B:
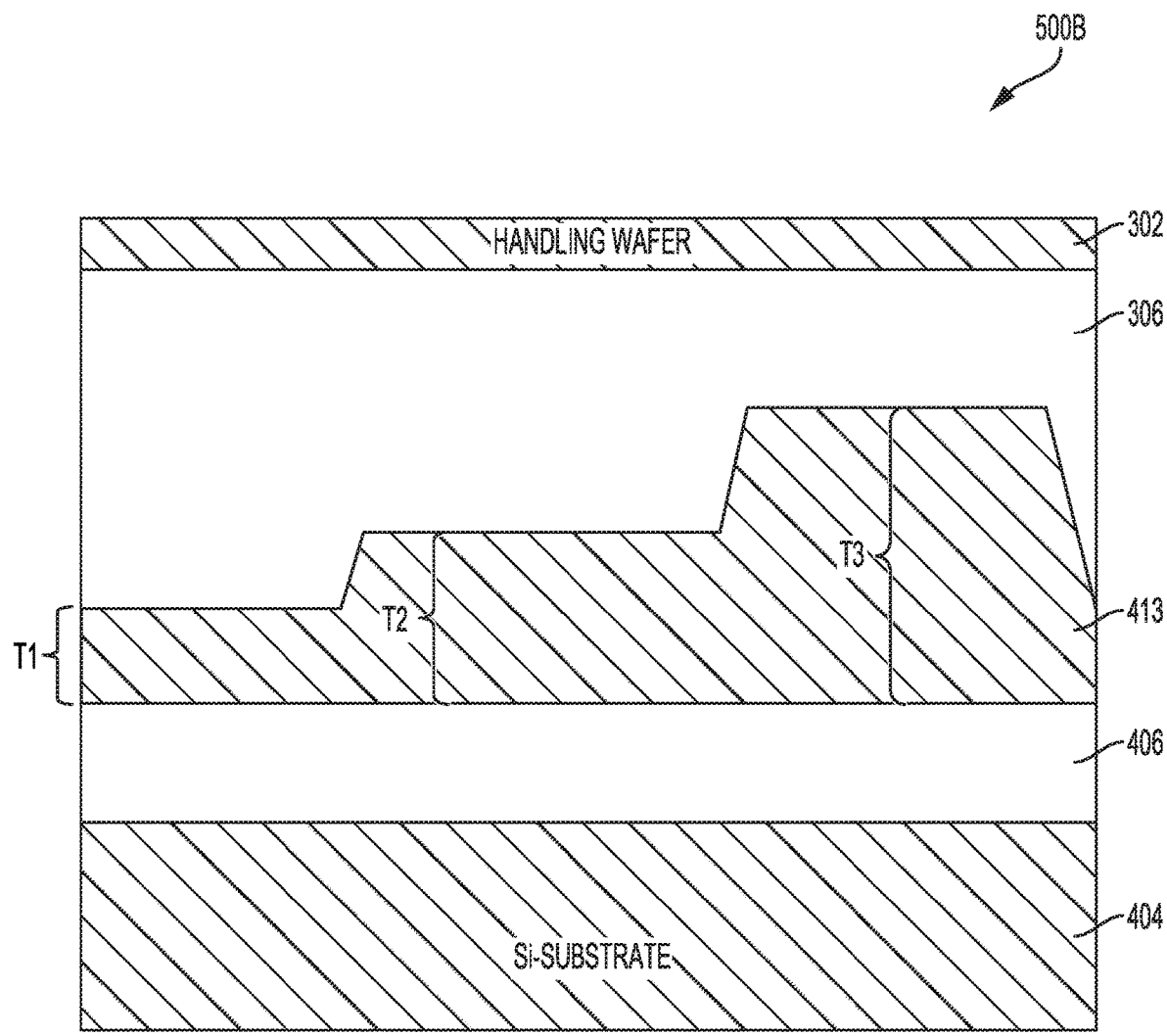

Referring to FIG. 5B, a second stage of the second method of fabricating the integrated RF circuit structure 300 with multiple semiconductor thicknesses is depicted and generally designated 500B. The formation of the medium and thick silicon regions is followed by depositing the isolation layer 306 (e.g., silicon dioxide layer). Chemical mechanical planarization (CMP) is performed on the silicon dioxide layer and then the isolation layer 306 is bonded to the handling wafer 302, as illustrated by FIG. 5B.

Figure 5C:
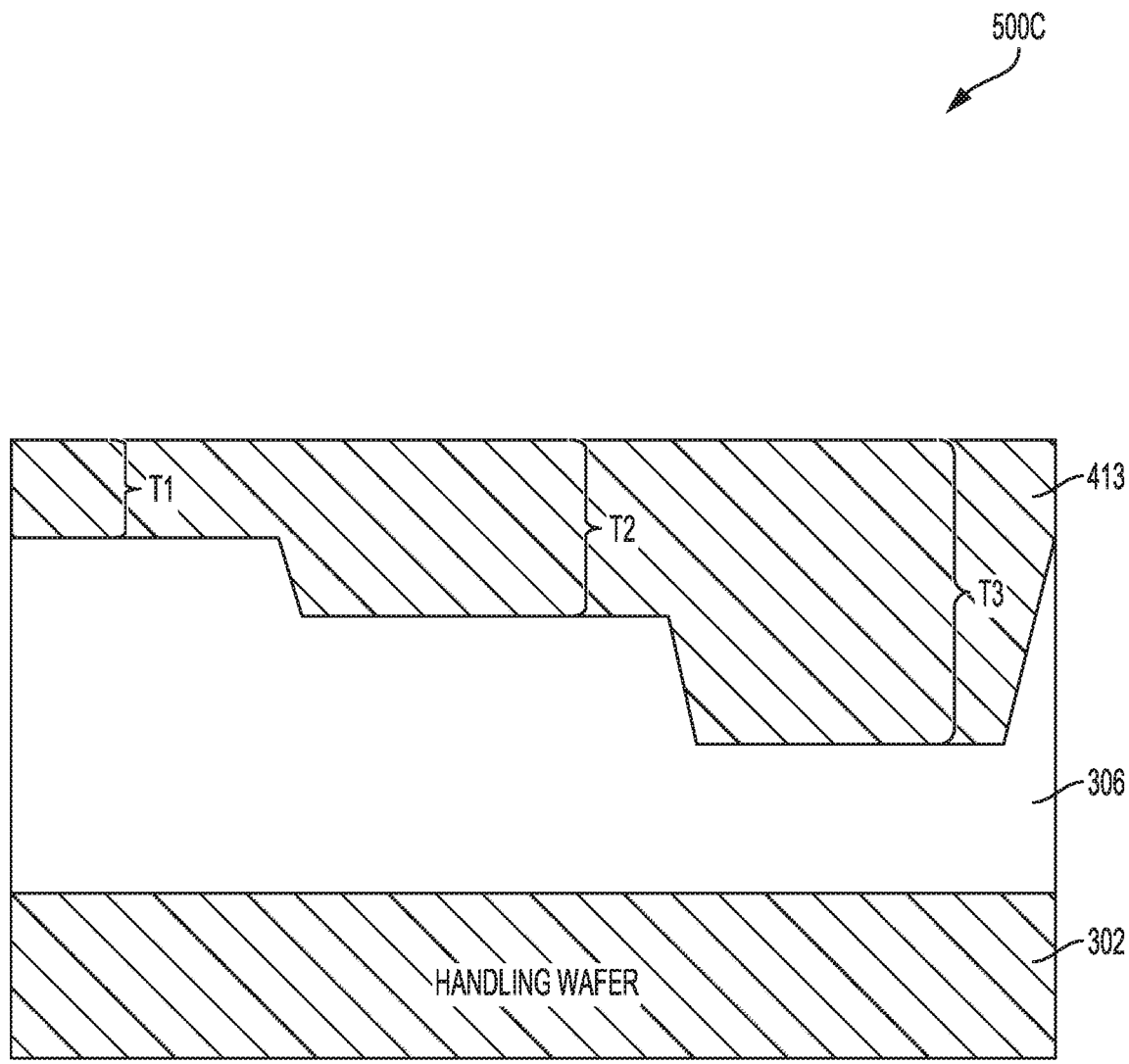

Referring to FIG. 5C, a third stage of the second method of fabricating the integrated RF circuit structure 300 with multiple semiconductor thicknesses is depicted and generally designated 500C. The third stage of the second method illustrated by FIG. 5C is similar to the fourth stage of the first method illustrated by FIG. 4D where the back-side silicon substrate (e.g., the semiconductor wafer 404) and the isolation layer 406 are etched away. In one aspect, the integrated RF circuit structure 300 is flipped before the etching of the semiconductor wafer 404 and the isolation layer 406.

Figure 5D:
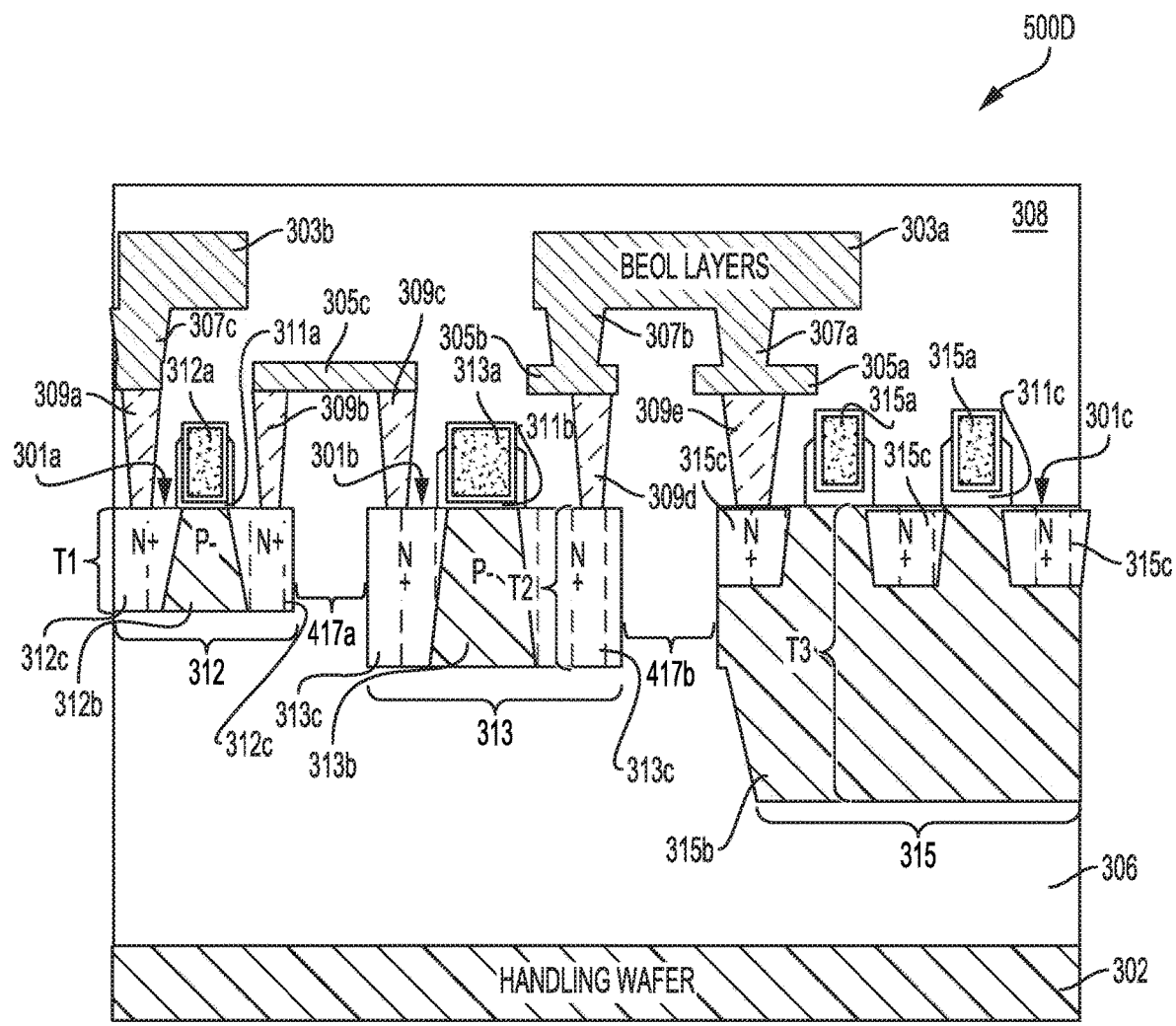

Referring to FIG. 5D, a fourth stage of the second method of fabricating the integrated RF circuit structure 300 with multiple semiconductor thicknesses is depicted and generally designated 500D. The fourth stage of the second method illustrated by FIG. 5D is similar to the fifth stage of the first method illustrated by FIG. 4E where the trench insulation is formed to separate active devices with different silicon thicknesses followed by FEOL and BEOL processes.

Figure 6:
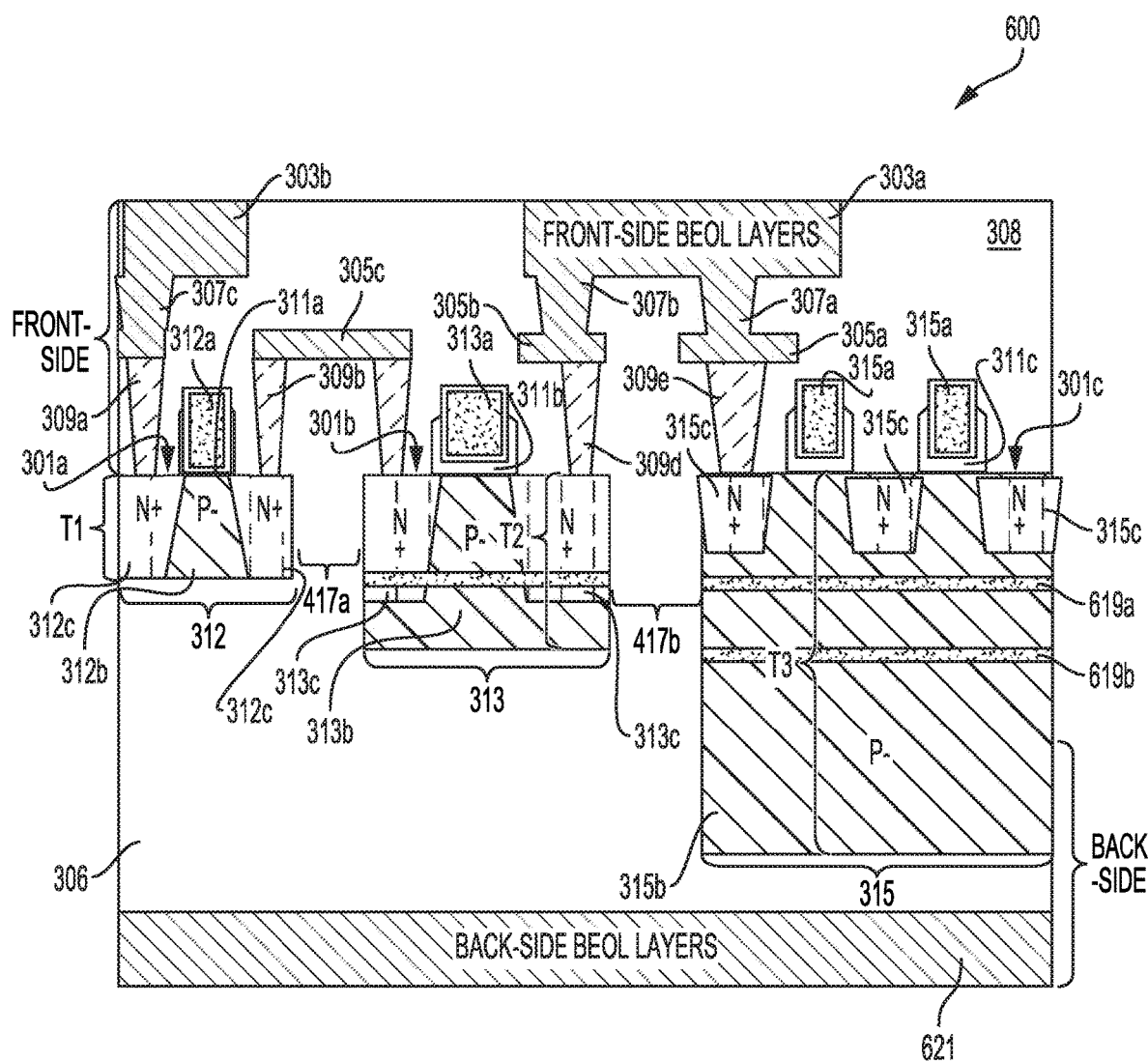
FIG. 6 is a cross-sectional view of an integrated radio frequency (RF) circuit structure with multiple semiconductor thicknesses, according to aspects of the present disclosure.

FIG. 6 is a cross-sectional view of an integrated radio frequency (RF) circuit structure 600 with multiple semiconductor thicknesses, according to aspects of the present disclosure. For illustrative purposes, some of the labelling and numbering of the devices and features of FIG. 6 are similar to those of FIG. 3. However, the integrated radio frequency circuit structure 600 includes radio frequency enhancement layers (e.g., a first radio frequency enhancement layer 619a and a second radio frequency enhancement layer 619b).

In one aspect, the radio frequency enhancement layers 619a and 619b may be a trap-rich layer or etch stop layer composed of silicon germanium (SiGe) embedded in the integrated radio frequency circuit structure 600. Furthermore, the integrated radio frequency circuit structure 600 illustrates BEOL layers on opposite sides of the active devices. For example, the integrated radio frequency circuit structure 600 includes vias 307a-307c and 309a-309e, as well as interconnects 303a, 303b, and 305a-305c of a front-side of the active devices. The integrated radio frequency circuit structure 600 also includes back-side BEOL layers 621 on the isolation layer 306. Optionally, the integrated radio frequency circuit structure 600 may include a handle wafer 302 on the front-side dielectric layer 308 as well as on the interconnects 303a and 303b.

FIGS. 7A, 7B, 7C, 7D, 7E, and 7F are exemplary diagrams illustrating stages of a third method of fabricating an integrated radio frequency (RF) circuit structure (e.g., the integrated radio frequency circuit structure 600) with multiple semiconductor thicknesses, according to an aspect of the present disclosure. For illustrative purposes, some of the labelling and numbering of the devices and features of FIGS. 7A, 7B, 7C, 7D, 7E, and 7F are similar to those of FIGS. 4A, 4B, 4C, 4D, and 4E as well as FIG. 6.

Figure 7A:
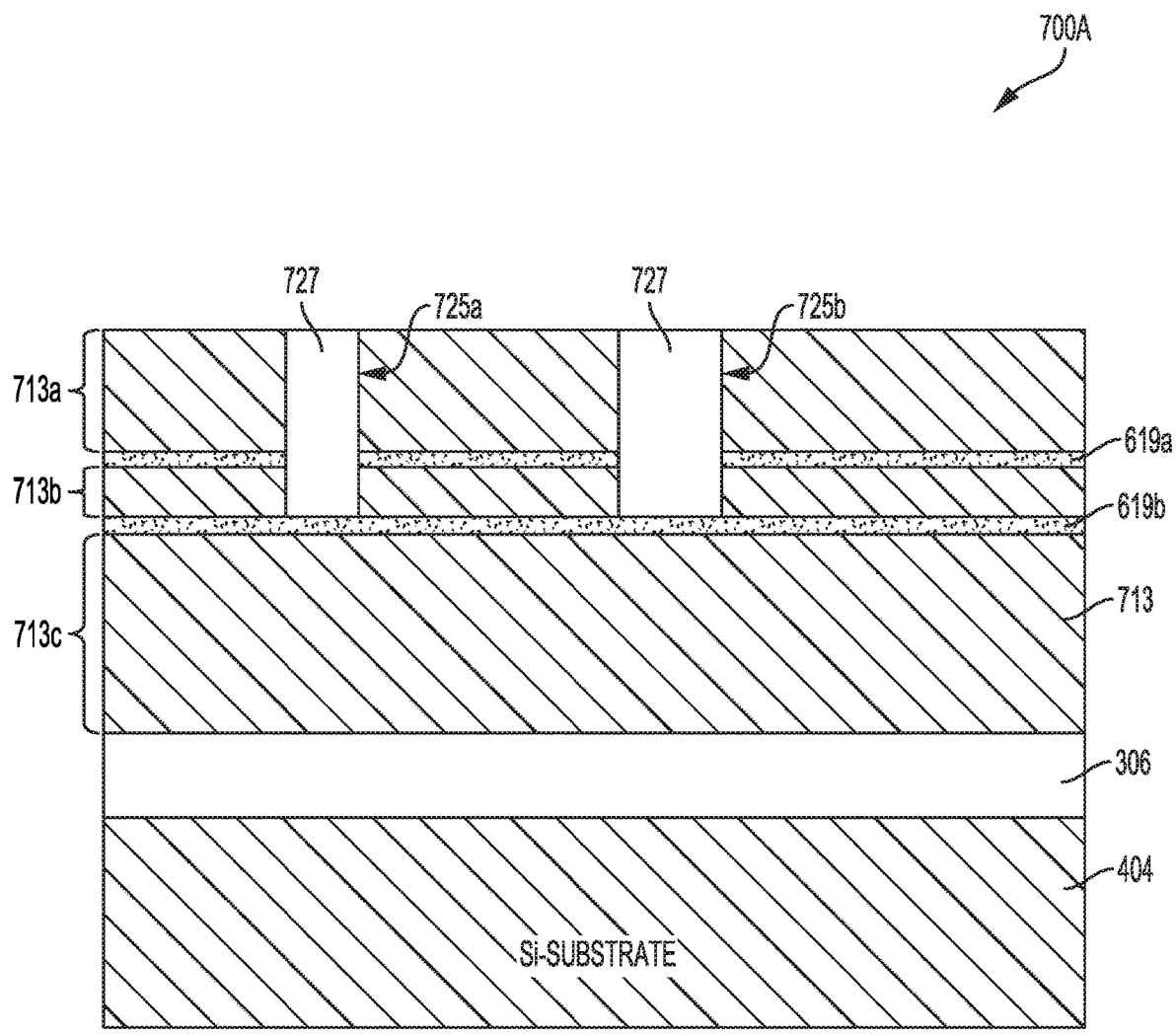
FIGS. 7A, 7B, 7C, 7D, 7E, and 7F are exemplary diagrams illustrating stages of a third method of fabricating an integrated radio frequency (RF) circuit structure with multiple semiconductor thicknesses, according to an aspect of the present disclosure.

Referring to FIG. 7A, a first stage of the third method of fabricating the integrated radio frequency (RF) circuit structure 600 is generally designated 700A. FIG. 7A illustrates an SOI layer 713 on the isolation layer 306 supported by the semiconductor substrate 404. A stack of layers may be formed on the isolation layer 306. The stack of layers may include a first layer 713a of the SOI layer 713, the first radio frequency enhancement layer 619a (e.g., a thin SiGe layer), a second layer 713b of the SOI layer 713, the second radio frequency enhancement layer 619b (e.g., a thin SiGe layer), and a third layer 713c of the SOI layer 713. The second layer 713b of the SOI layer 713 is between the first radio frequency enhancement layer 619a and the second radio frequency enhancement layer 619b.

FIG. 7A further illustrates epitaxially growing the stack of layers and then etching the stack of layers to form trenches (e.g., a first trench 725a and a second trench 725b). For example, the second radio frequency enhancement layer 619b may be used as an etch stop layer for the trenches. The first trench 725a and the second trench 725b are then filled with trench insulation 727.

Figure 7B:
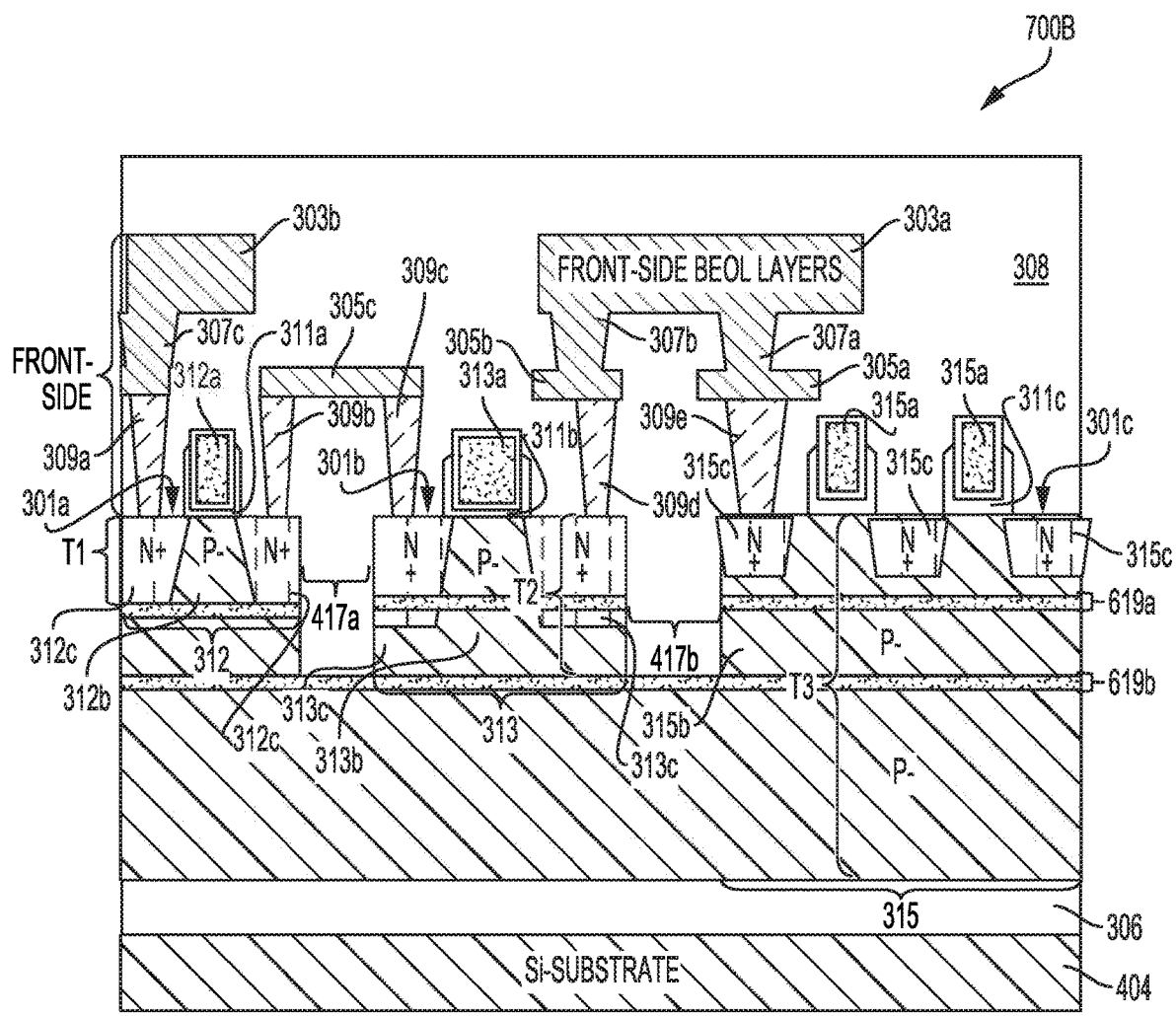

Referring to FIG. 7B, a second stage of the third method of fabricating the integrated radio frequency (RF) circuit structure 600 is generally designated 700B. The trench insulation (e.g., the first trench insulation region 417a (a shallow trench) and the second trench insulation region 417b (a deep trench)) is formed to separate active devices with different silicon thicknesses followed by FEOL processes for all of the active devices and BEOL processes at a front-side of the active devices.

Figure 7C:
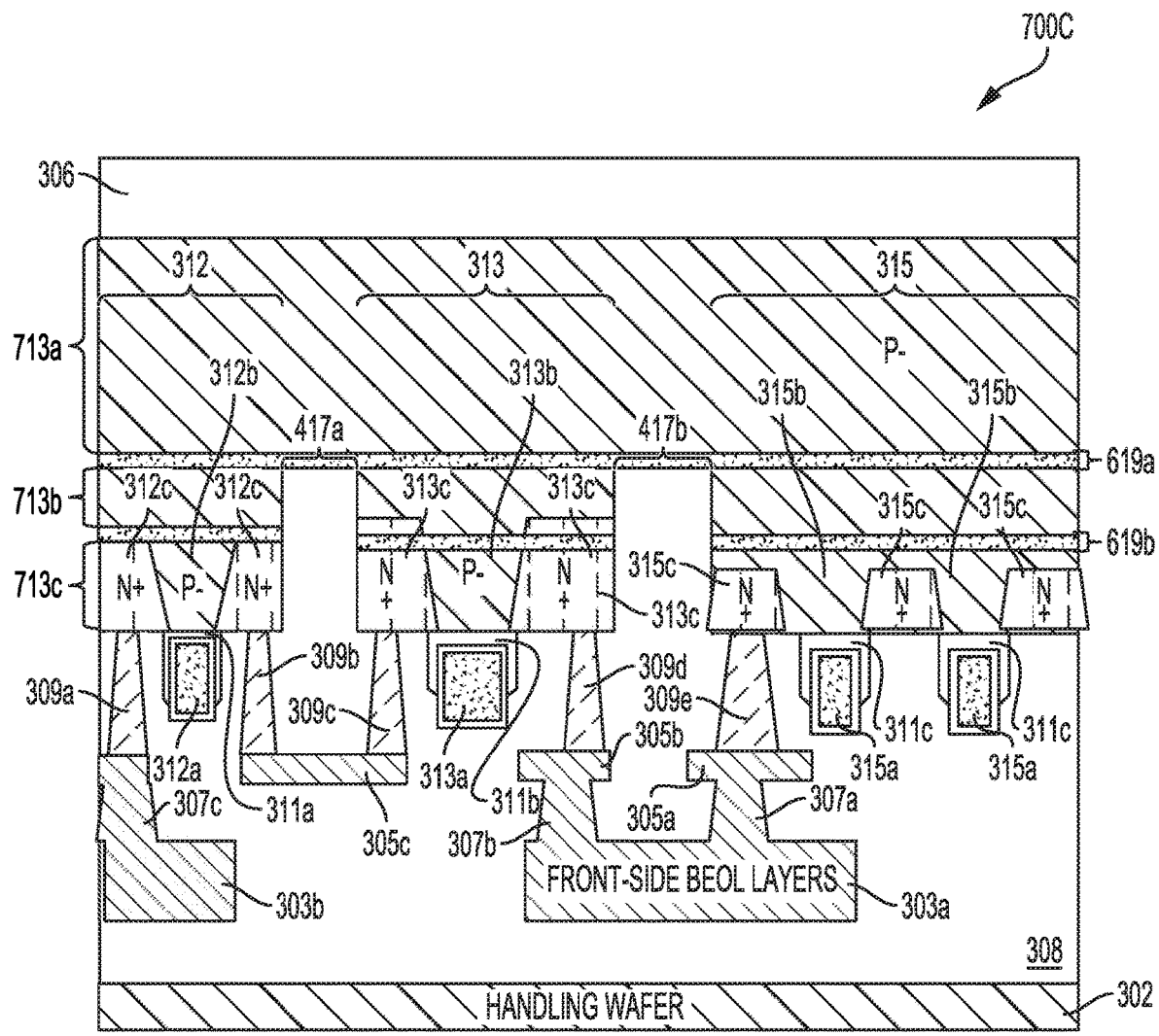

Referring to FIG. 7C, a third stage of the third method of fabricating the integrated radio frequency (RF) circuit structure 600 is generally designated 700C. The front-side dielectric layer 308 is bonded to the handling wafer 302. The integrated RF circuit structure 600 is then flipped followed by etching away the semiconductor substrate/wafer 404 up to the isolation layer 306 or buried oxide layer.

Figure 7D:
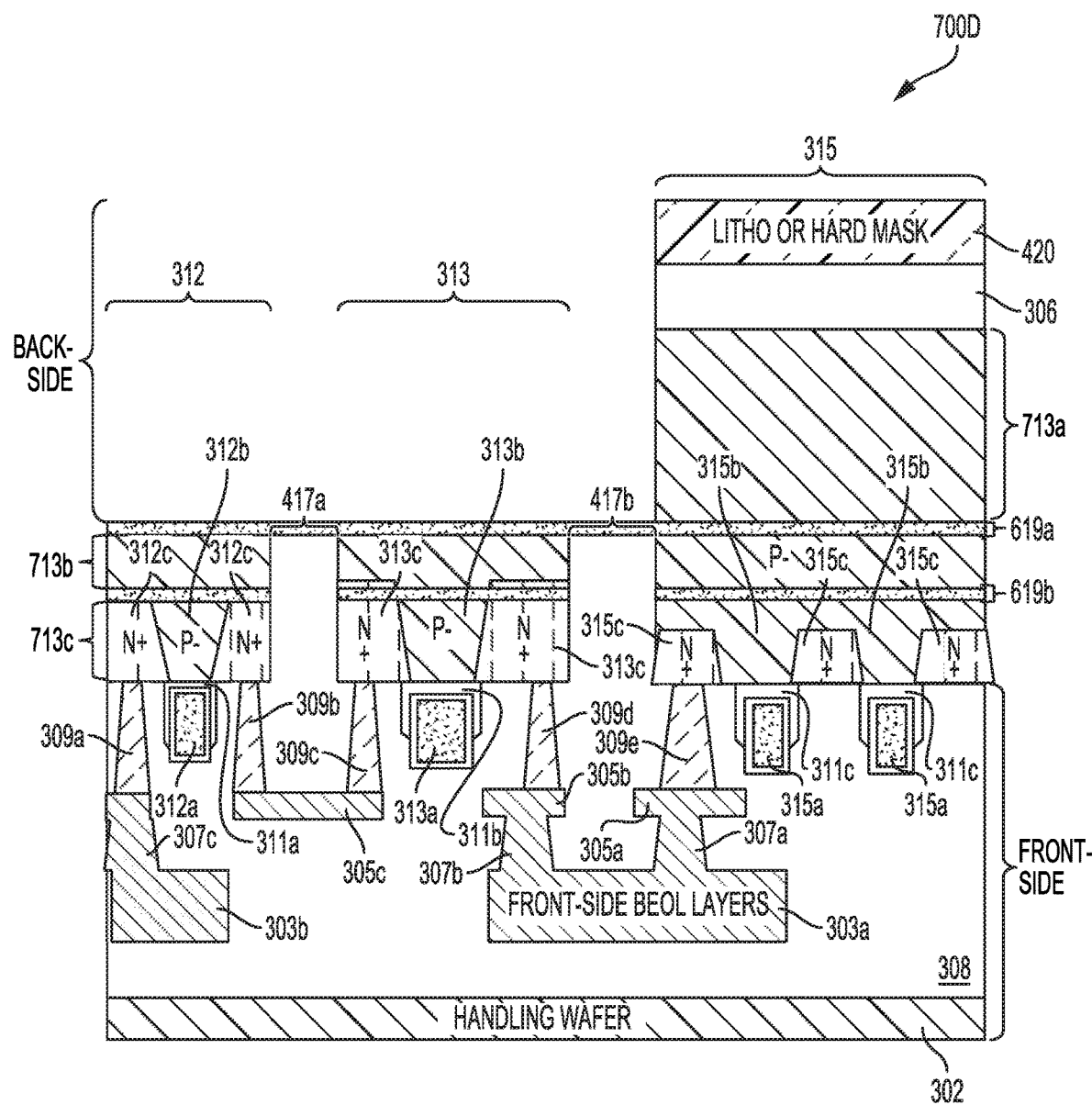

Referring to FIG. 7D, a fourth stage of the third method of fabricating the integrated radio frequency (RF) circuit structure 600 is generally designated 700D. Portions of the SOI layer 713 and the isolation layer 306 (at the back-side) that correspond to the first active device 312 and the second active device 313 are removed up to the first radio frequency enhancement layer 619a. For example, portions of the isolation layer 306 over the first active device 312 and the second active device 313 are removed or opened and the silicon from the SOI layer 713 over the first active device 312 and the second active device 313 is etched away. The etching is stopped at the first radio frequency enhancement layer 619a. For example, a lithography implementation or a hard mask (e.g., the hard mask 420) protects a region where the third active device 315 is fabricated while the regions near the first active device 312 and the second active device 313 are open. Thermal oxidation is then performed to consume the semiconductor (e.g., silicon) of the SOI layer 713.

Figure 7E:
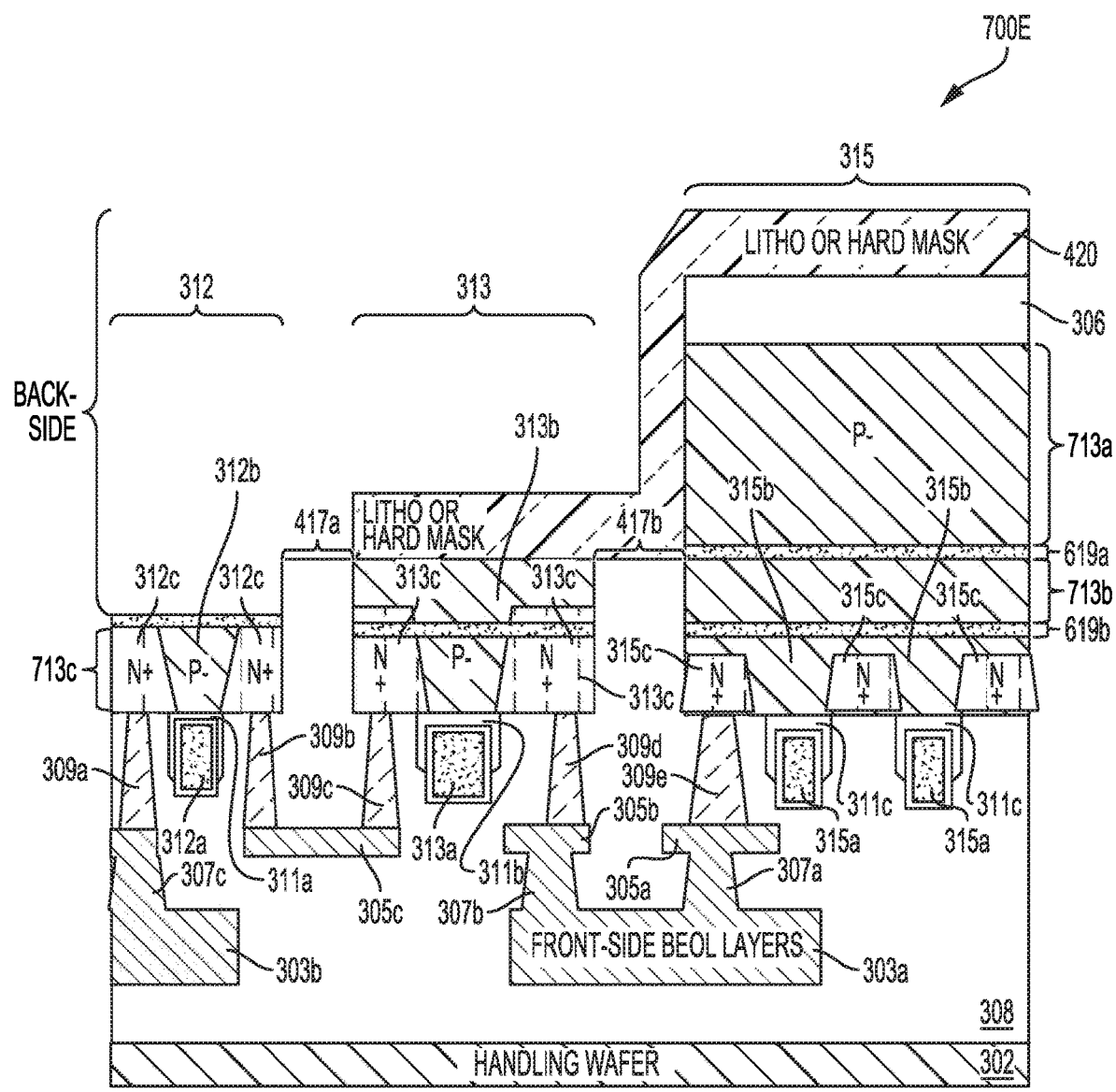

Referring to FIG. 7E, a fifth stage of the third method of fabricating the integrated radio frequency (RF) circuit structure 600 is generally designated 700E. Portions of the SOI layer 713 and the isolation layer 306 (at the back-side) that correspond to the first active device 312 are removed up to the second radio frequency enhancement layer 619b. For example, portions of the isolation layer 306 over the first active device 312 are removed or opened and the silicon from the SOI layer 713 over the first active device 312 is etched away. The etching stops at the second radio frequency enhancement layer 619b. For example, a lithography implementation or a hard mask (e.g., the hard mask 420) protects a region where the second active device 313 and the third active device 315 are fabricated when the region where the first active device 312 is open. Thermal oxidation is then performed to consume the semiconductor (e.g., silicon) of the SOI layer 713.

Figure 7F:
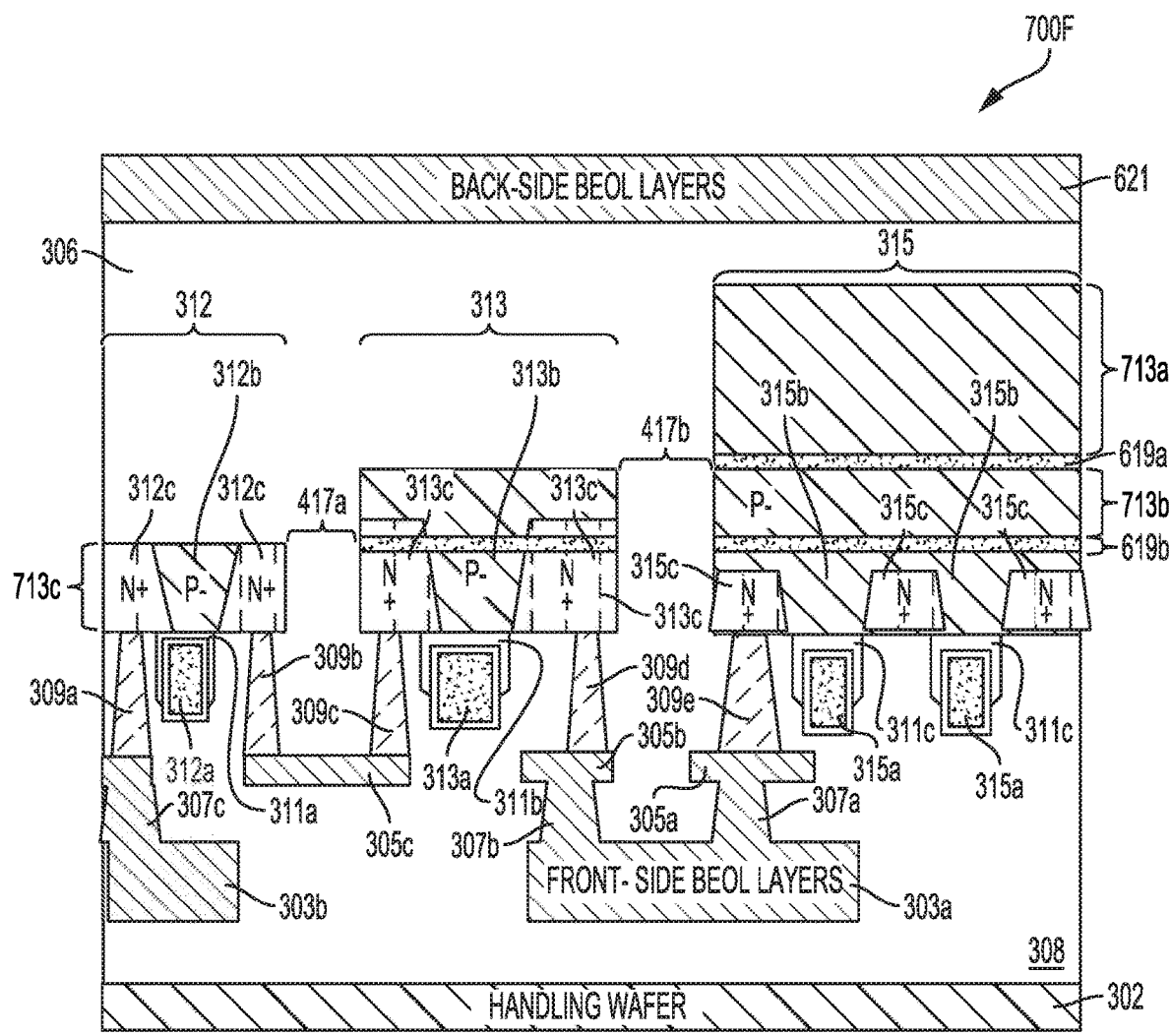

Referring to FIG. 7F, a sixth stage of the third method of fabricating the integrated radio frequency (RF) circuit structure 600 is generally designated 700F. The hard mask 420 is removed and an isolation material (e.g., $SiO_2$) is refilled on the first active device 312, the second active device 313, and the third active device 315 on the back-side. The isolation material may form the isolation layer 306. In addition, chemical mechanical planarization is performed on the isolation layer 306 up to the desirable thickness of each of the first active device 312, the second active device 313, and the third active device 315 to expose contacts to the first active device 312, the second active device 313, and the third active device 315. The chemical mechanical planarization process is then followed by BEOL processes at the back-side of the active devices.

Figure 8:
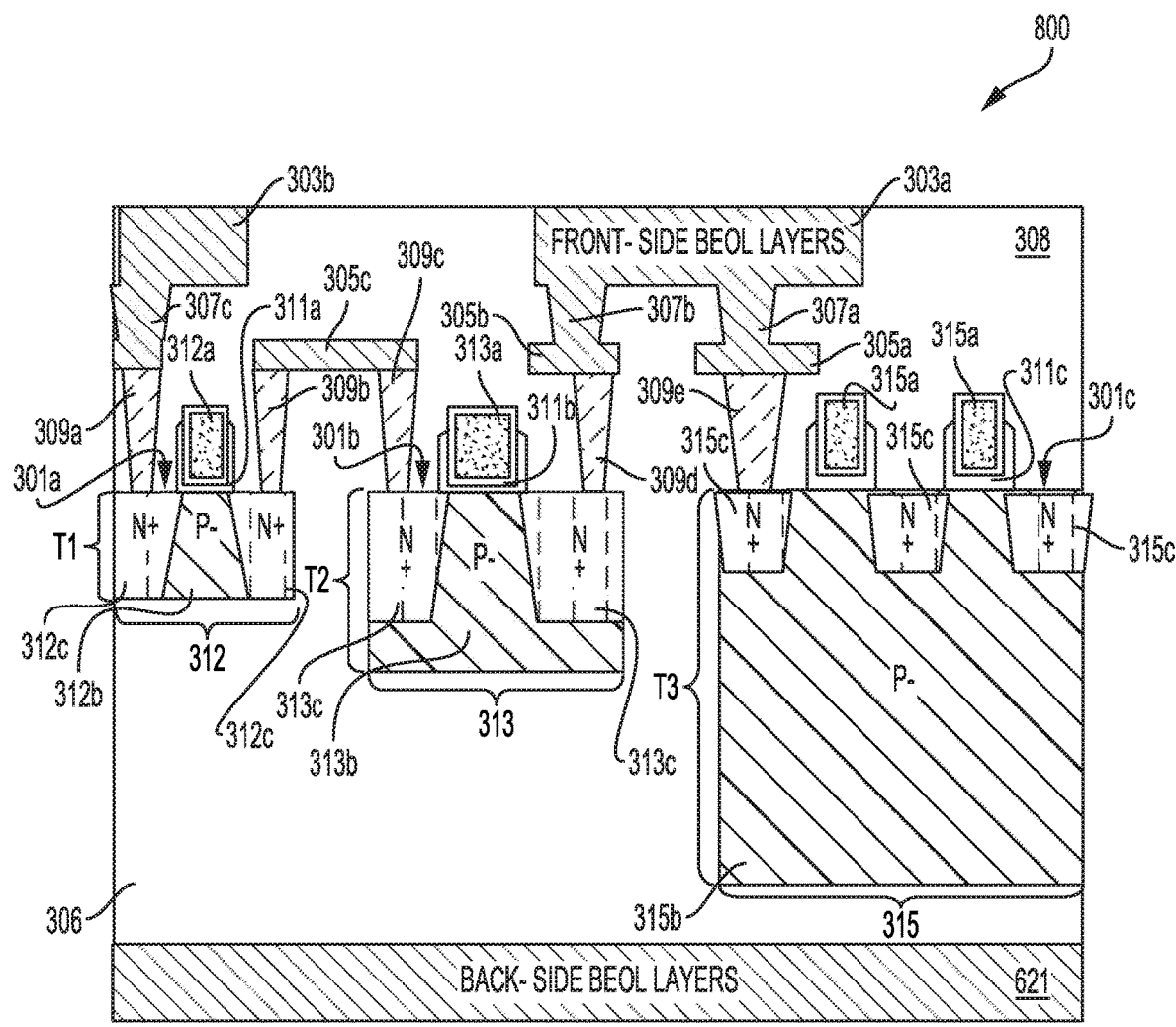
FIG. 8 is a cross-sectional view of an integrated radio frequency (RF) circuit structure with multiple semiconductor thicknesses, according to aspects of the present disclosure.

FIG. 8 is a cross-sectional view of an integrated radio frequency (RF) circuit structure 800 with multiple semiconductor thicknesses, according to aspects of the present disclosure. For illustrative purposes, some of the labelling and numbering of the devices and features of FIG. 8 are similar to those of FIG. 3. However, the integrated radio frequency circuit structure 800 includes back-side BEOL layers (e.g., back-side BEOL layers 621 illustrated in FIG. 6) on the isolation layer 306. Optionally, the integrated radio frequency circuit structure 800 may include a handle wafer 302 on the front-side dielectric layer 308 as well as the interconnects 303a and 303b.

FIGS. 9A, 9B, 9C, 9D, 9E, and 9F are exemplary diagrams illustrating stages of a fourth method of fabricating an integrated radio frequency (RF) circuit structure 800 with multiple semiconductor thicknesses, according to an aspect of the present disclosure. For illustrative purposes, some of the labelling and numbering of the devices and features of FIGS. 9A, 9B, 9C, 9D, 9E, and 9F are similar to those of FIGS. 7A, 7B, 7C, 7D, 7E, and 7F as well as FIG. 3.

Figure 9A:
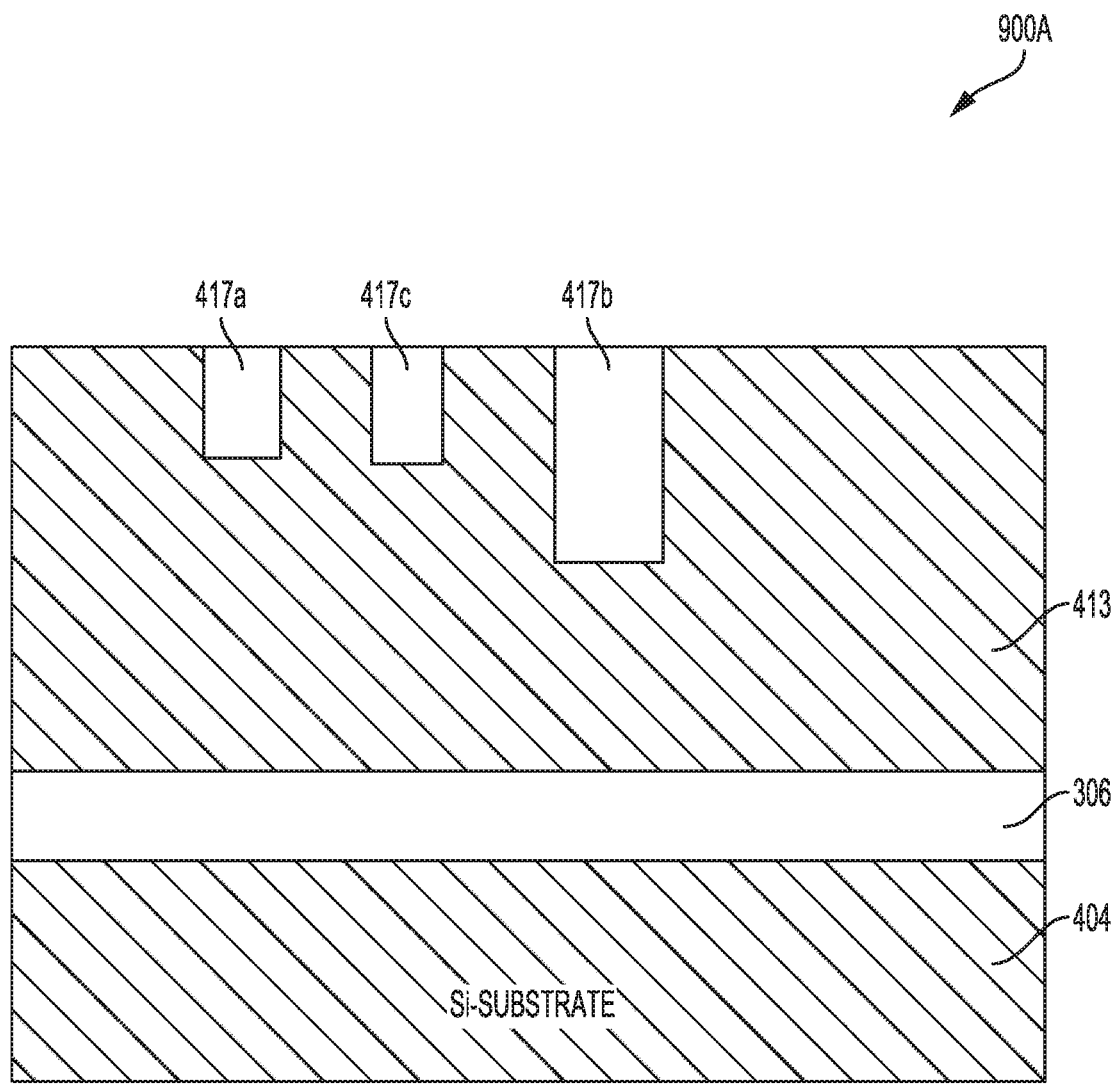
FIGS. 9A, 9B, 9C, 9D, 9E, and 9F are exemplary diagrams illustrating stages of a fourth method of fabricating an integrated radio frequency (RF) circuit structure with multiple semiconductor thicknesses, according to an aspect of the present disclosure.

Referring to FIG. 9A, a first stage of the fourth method of fabricating the integrated RF circuit structure 800 with multiple semiconductor thicknesses is depicted and generally designated 900A. FIG. 9A illustrates a silicon on insulator (SOI) wafer (e.g., SOI layer 413) with a thickness (e.g., the third thickness T3 illustrated in FIG. 3). Trench insulation of different depths are formed. For example, the SOI layer 413 is etched to create trenches and the trenches are then filled with trench insulation to form trench insulation regions. The trench insulation regions (e.g., the first trench insulation region 417a and the second trench insulation region 417b) are formed to separate active devices with different silicon thicknesses or depths. The second trench insulation region 417b may be deemed a deep trench insulation region because it is deeper than the first trench insulation region 417a, which may be deemed a shallow trench insulation region. Other trench insulation regions (e.g., trench insulation region 417c) may be included in the integrated RF circuit structure 800. For example, the trench insulation region 417c may be included to support laterally diffused metal oxide semiconductor field effect transistor (LDMOS) implementations.

Figure 9B:
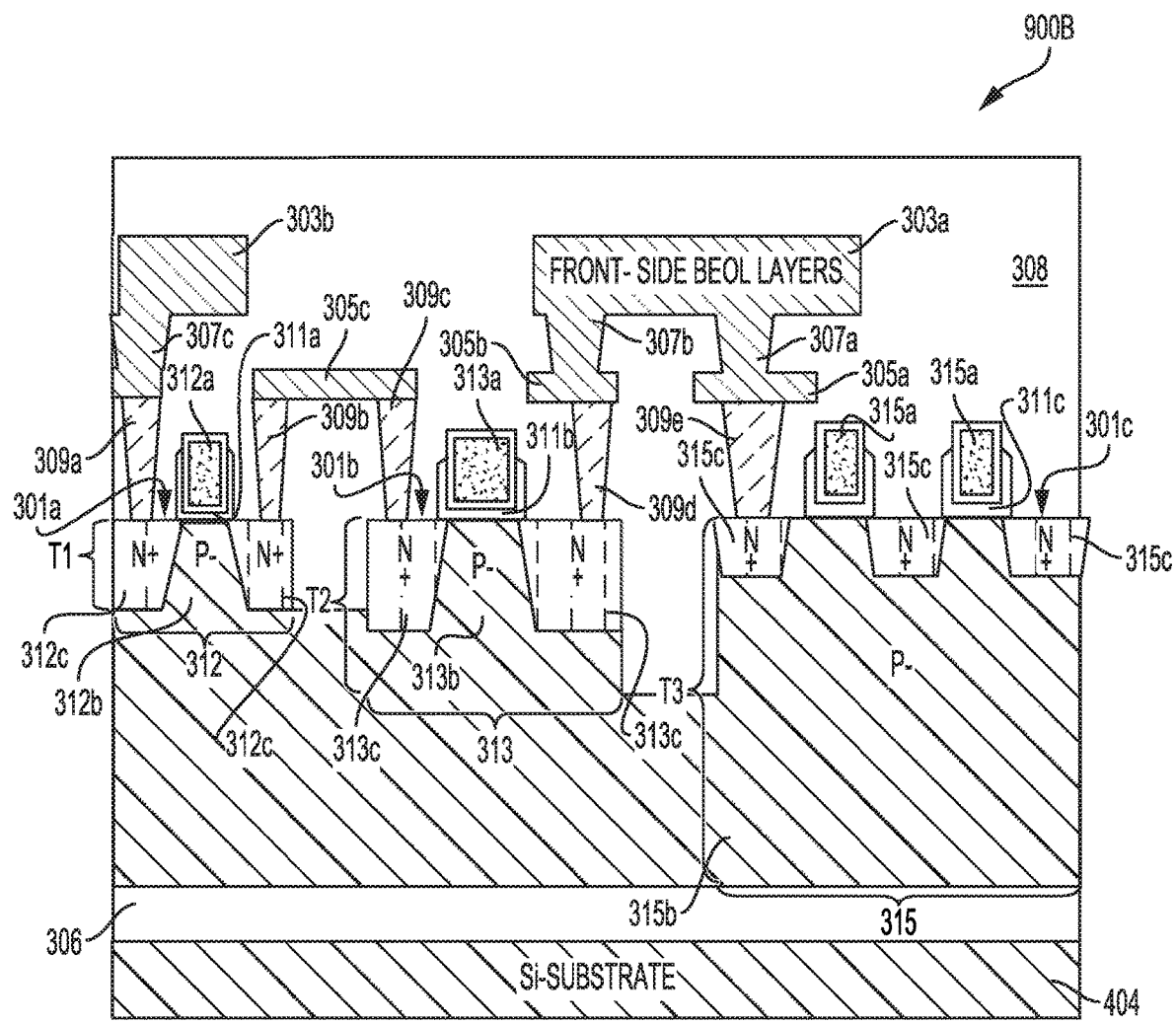

Referring to FIG. 9B, a second stage of the fourth method of fabricating the integrated RF circuit structure 800 with multiple semiconductor thicknesses is depicted and generally designated 900B. The formation of the trench insulation regions is followed by standard FEOL processes to form the active devices and the BEOL processes to form to form interconnects or semiconductive structures at the front-side.

Figure 9C:
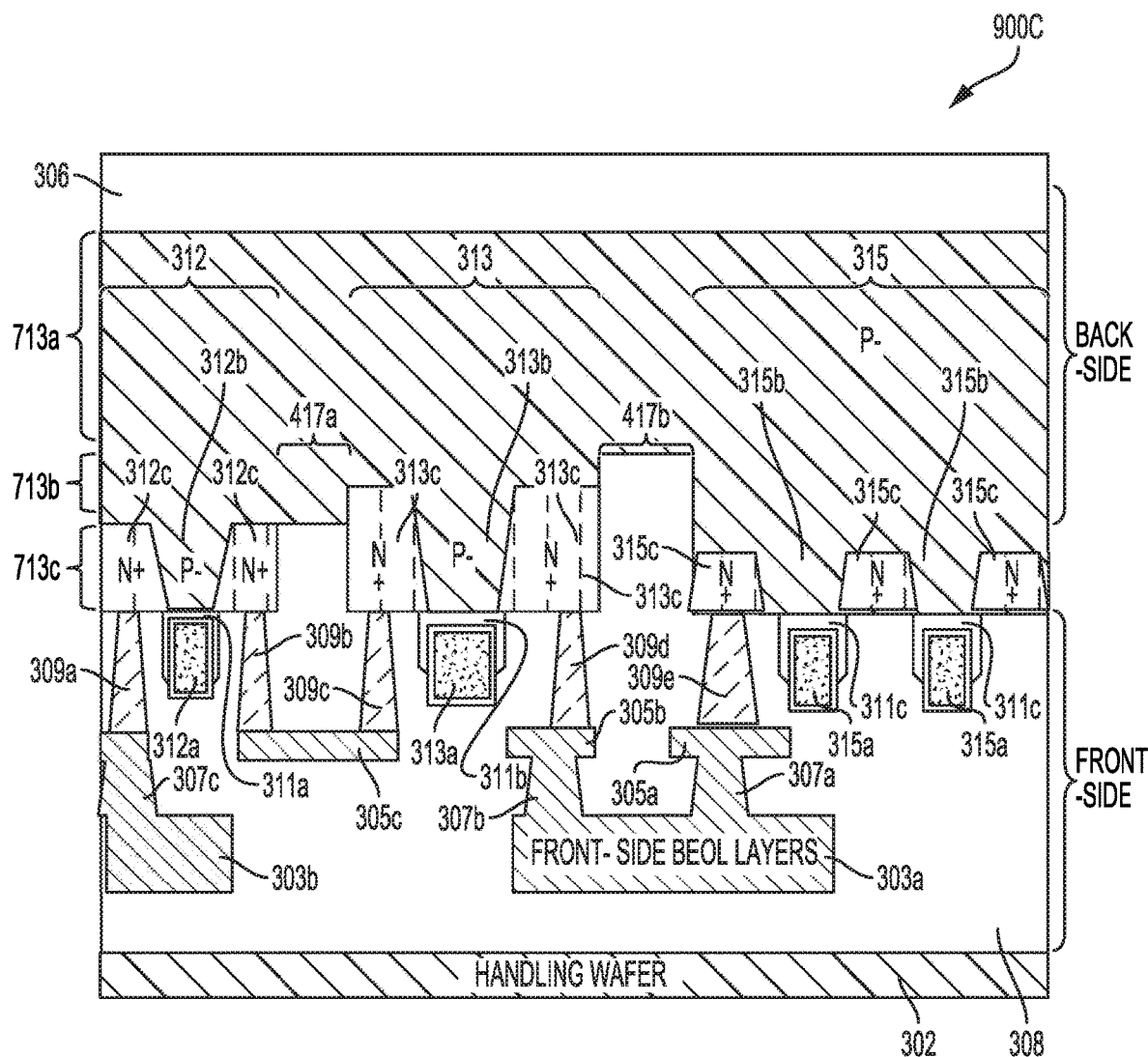

Referring to FIG. 9C, a third stage of the fourth method of fabricating the integrated RF circuit structure 800 with multiple semiconductor thicknesses is depicted and generally designated 900C. The dielectric layer 308 on the front-side is bonded to the handling wafer 302. The integrated RF circuit structure 800 is then flipped followed by etching away the semiconductor wafer 404, at the back-side, up to the isolation layer 306 or buried oxide layer.

Figure 9D:
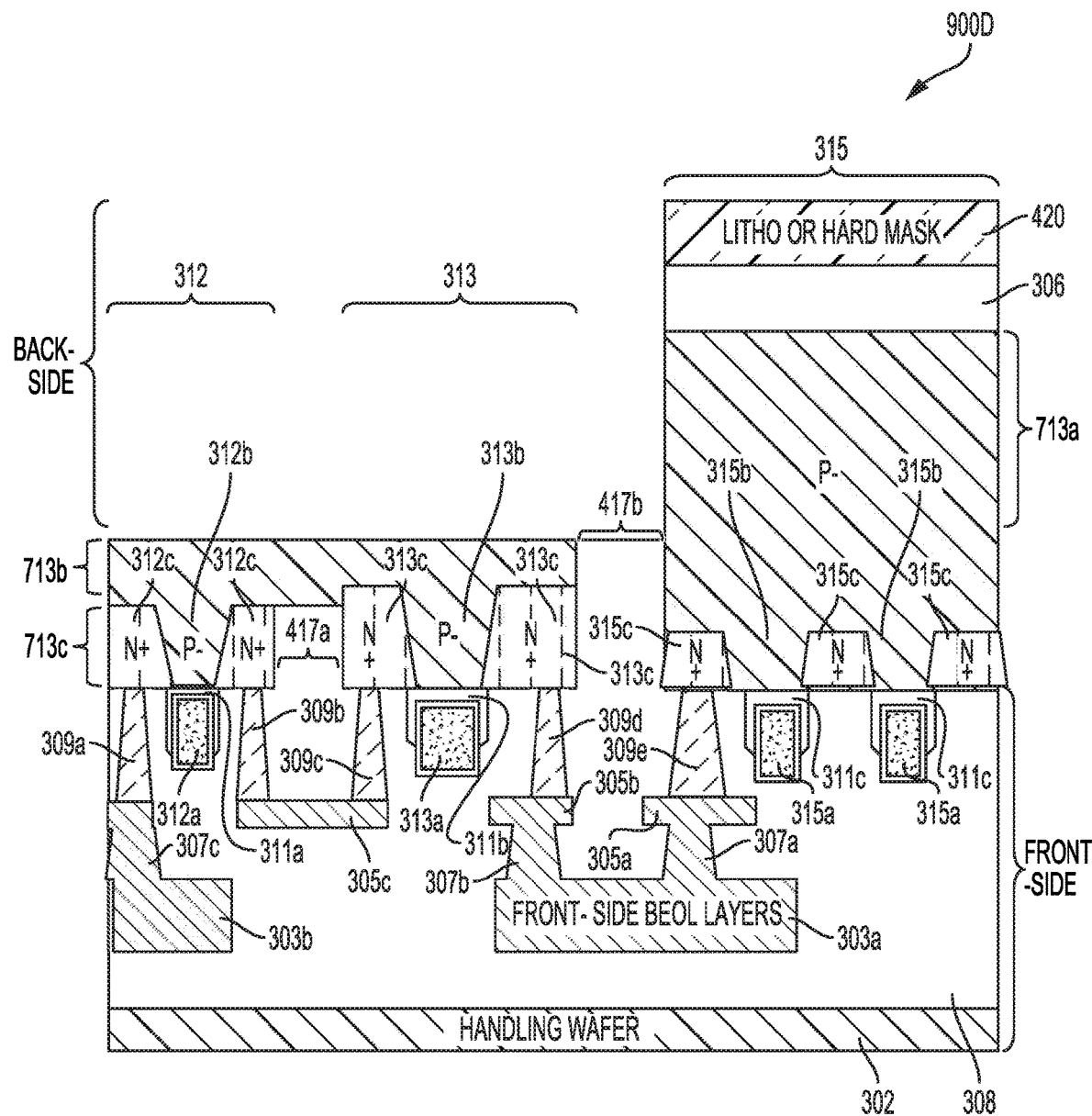

Referring to FIG. 9D, a fourth stage of the fourth method of fabricating the integrated RF circuit structure 800 with multiple semiconductor thicknesses is depicted and generally designated 900D. Portions of the SOI layer 713 and the isolation layer 306 (at the back-side) that correspond to the first active device 312 and the second active device 313 are removed until an insulation material (e.g., silicon dioxide) in the deep trench is sensed. For example, portions of the isolation layer 306 over the first active device 312 and the second active device 313 are removed and the silicon from the SOI layer 713 over the first active device 312 and the second active device 313 is etched away. The etching is stopped when silicon dioxide of the second trench insulation region 417b is sensed. In one aspect, a lithography implementation or a hard mask (e.g., the hard mask 420) protects a region where the third active device 315 is fabricated near the region where the first active device 312 and the second active device 313 are open. Thermal oxidation is then performed to consume the semiconductor (e.g., silicon) of the SOI layer 713.

Figure 9E:
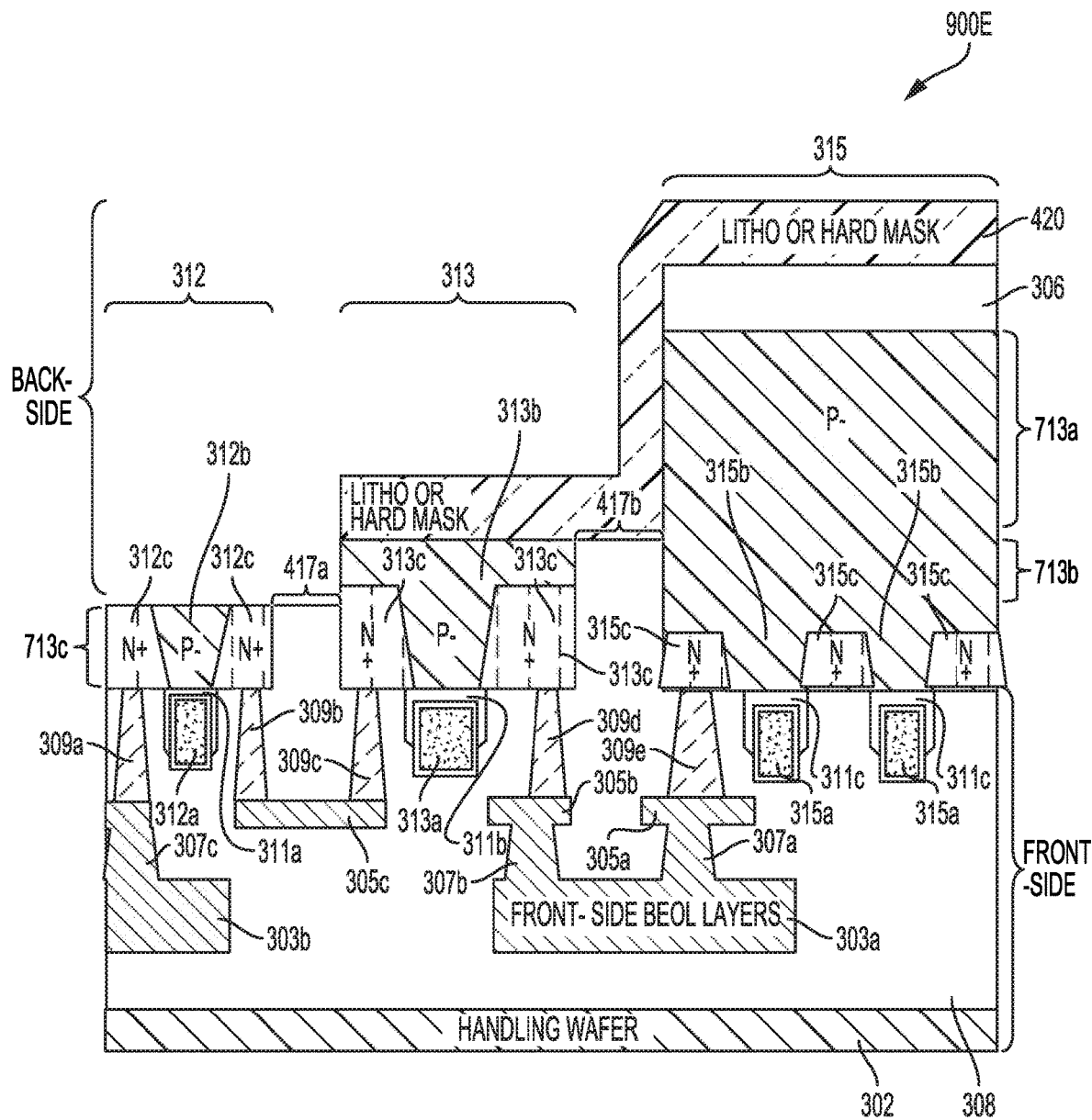

Referring to FIG. 9E, a fifth stage of the fourth method of fabricating the integrated radio frequency (RF) circuit structure 800 is generally designated 900E. Portions of the SOI layer 713 and the isolation layer 306 (at the back-side) that correspond to the first active device 312 are removed until an insulation material (e.g., silicon dioxide) in the shallow trench is sensed. For example, portions of the isolation layer 306 over the first active device 312 are removed and the silicon from the SOI layer 713 over the first active device 312 is etched away. The etching stops when silicon dioxide of the first trench insulation region 417a is sensed. In one aspect, a lithography implementation or a hard mask (e.g., the hard mask 420) protects a region where the second active device 313 and the third active device 315 is fabricated when the region near the first active device 312 is open. Thermal oxidation is then performed to consume the semiconductor (e.g., silicon) of the SOI layer 713.

Figure 9F:
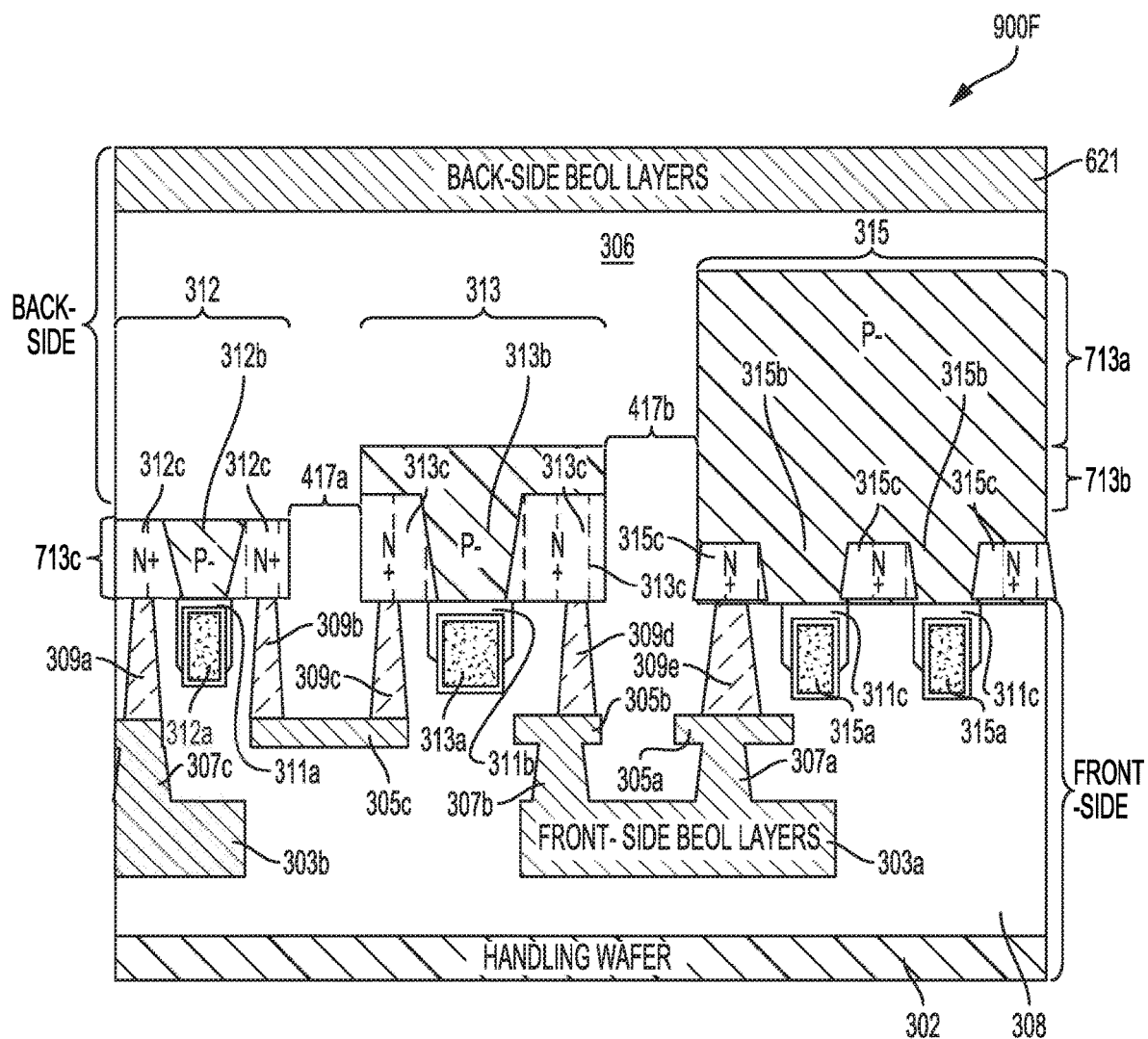

Referring to FIG. 9F, a sixth stage of the fourth method of fabricating the integrated radio frequency (RF) circuit structure 800 is generally designated 900F. The hard mask 420 is removed and an isolation material (e.g., $SiO_2$) is refilled on the first active device 312, the second active device 313, and the third active device on the back-side. For example, the isolation material forms the isolation layer 306. In addition, chemical mechanical planarization is performed on the isolation layer 306 up to the desirable thickness of each of the first active device 312, the second active device 313, and the third active device 315 to expose contacts to the first active device 312, the second active device 313, and the third active device 315. The chemical mechanical planarization process is then followed by BEOL processes at the back-side of the active devices.

Figure 10:
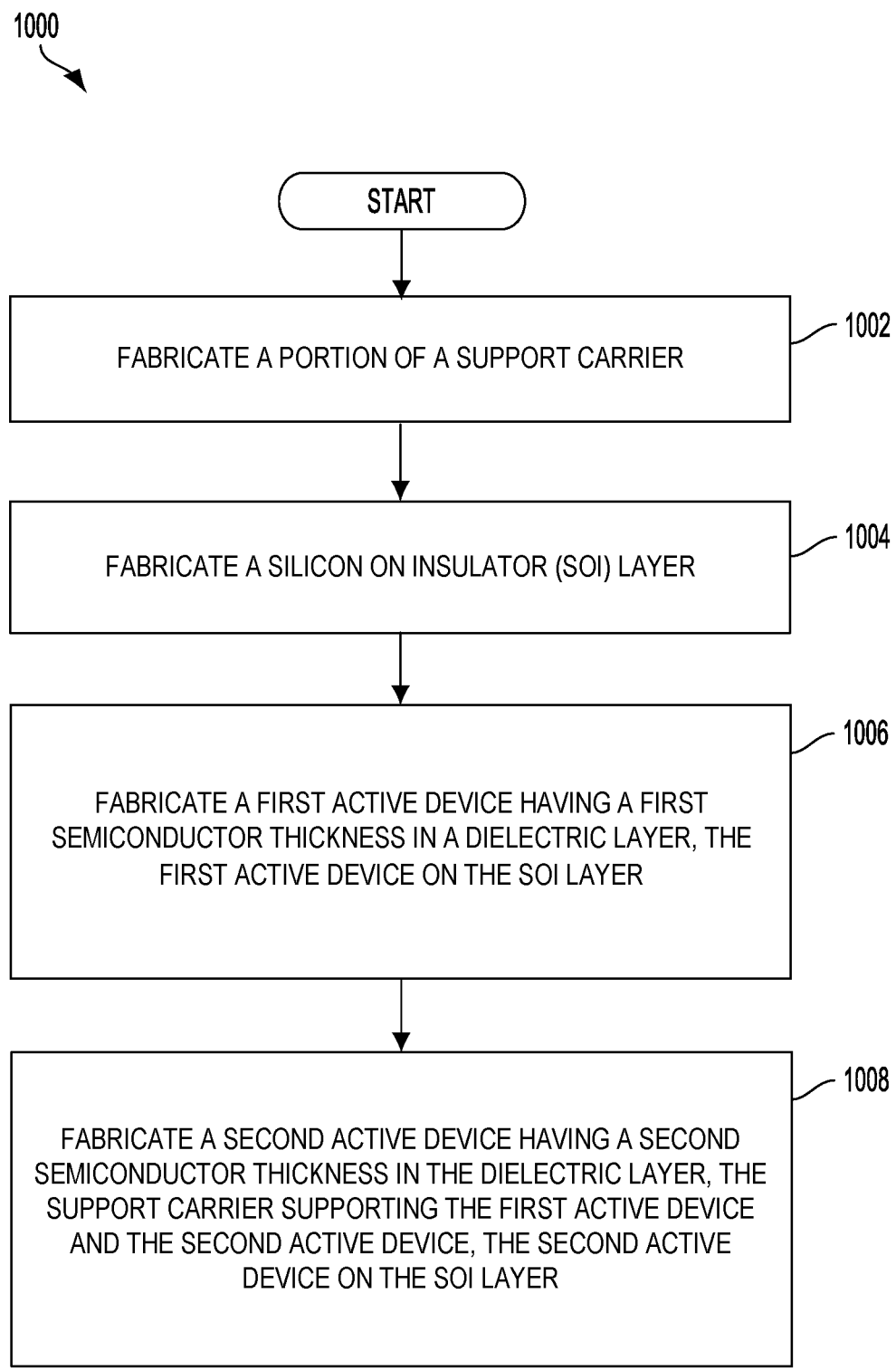
FIG. 10 is a process flow diagram illustrating a method of constructing an integrated radio frequency (RF) circuit structure with multiple semiconductor thicknesses, according to an aspect of the present disclosure.

FIG. 10 is a process flow diagram illustrating a method 1000 of constructing an integrated radio frequency (RF) circuit structure with multiple semiconductor thicknesses, according to an aspect of the present disclosure. At block 1002, at least a portion of a support carrier (e.g., a handle wafer) is fabricated. At block 1004, a silicon on insulator (SOI) layer is fabricated. At block 1006, a first active device having a first semiconductor thickness in a dielectric layer is fabricated. The first active device is on the SOI layer. At block 1008, a second active device having a second semiconductor thickness in the dielectric layer is fabricated. The support carrier supports the first active device and the second active device. The second active device is on the SOI layer.

According to a further aspect of the present disclosure, an integrated circuit device is described. The integrated circuit device includes first means for controlling electron flow and second means for controlling electron flow. The first electron flow control means may be the first active device 312, shown in FIGS. 3 and 4E. The second electron flow control means may be the second active device 313, shown in FIGS. 3 and 4E. In another aspect, the aforementioned means may be any module or any apparatus configured to perform the functions recited by the aforementioned means.

Figure 11:
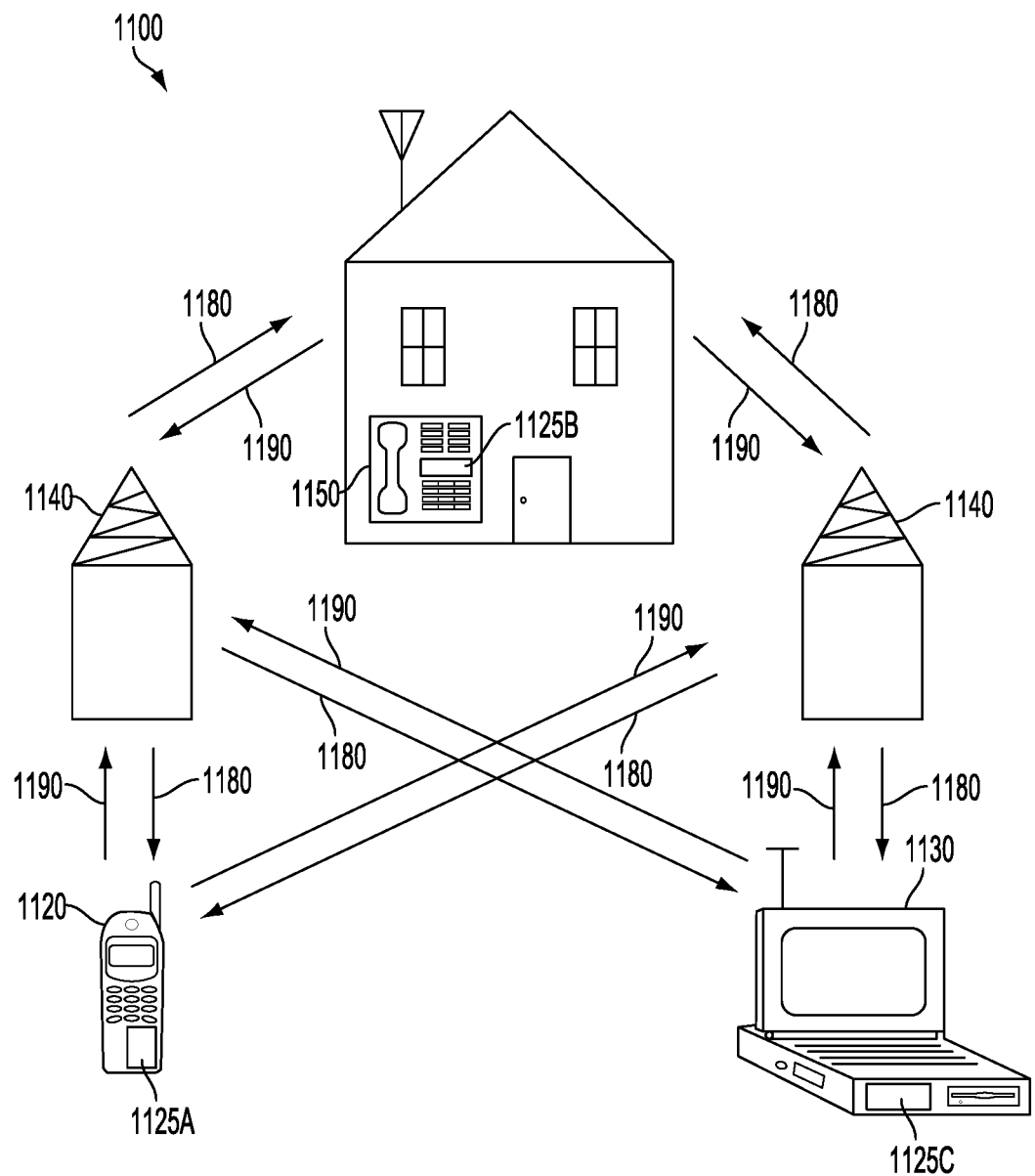
FIG. 11 is a block diagram showing an exemplary wireless communications system in which a configuration of the disclosure may be advantageously employed.

FIG. 11 is a block diagram showing an exemplary wireless communications system 1100 in which an aspect of the disclosure may be advantageously employed. For purposes of illustration, FIG. 11 shows three remote units 1120, 1130, and 1150 and two base stations 1140. It will be recognized that wireless communications systems may have many more remote units and base stations. Remote units 1120, 1130, and 1150 include IC devices 1125A, 1125C, and 1125B that include the disclosed integrated circuit devices. It will be recognized that other devices may also include the disclosed integrated circuit devices, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, a remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed integrated circuit device.

Figure 12:
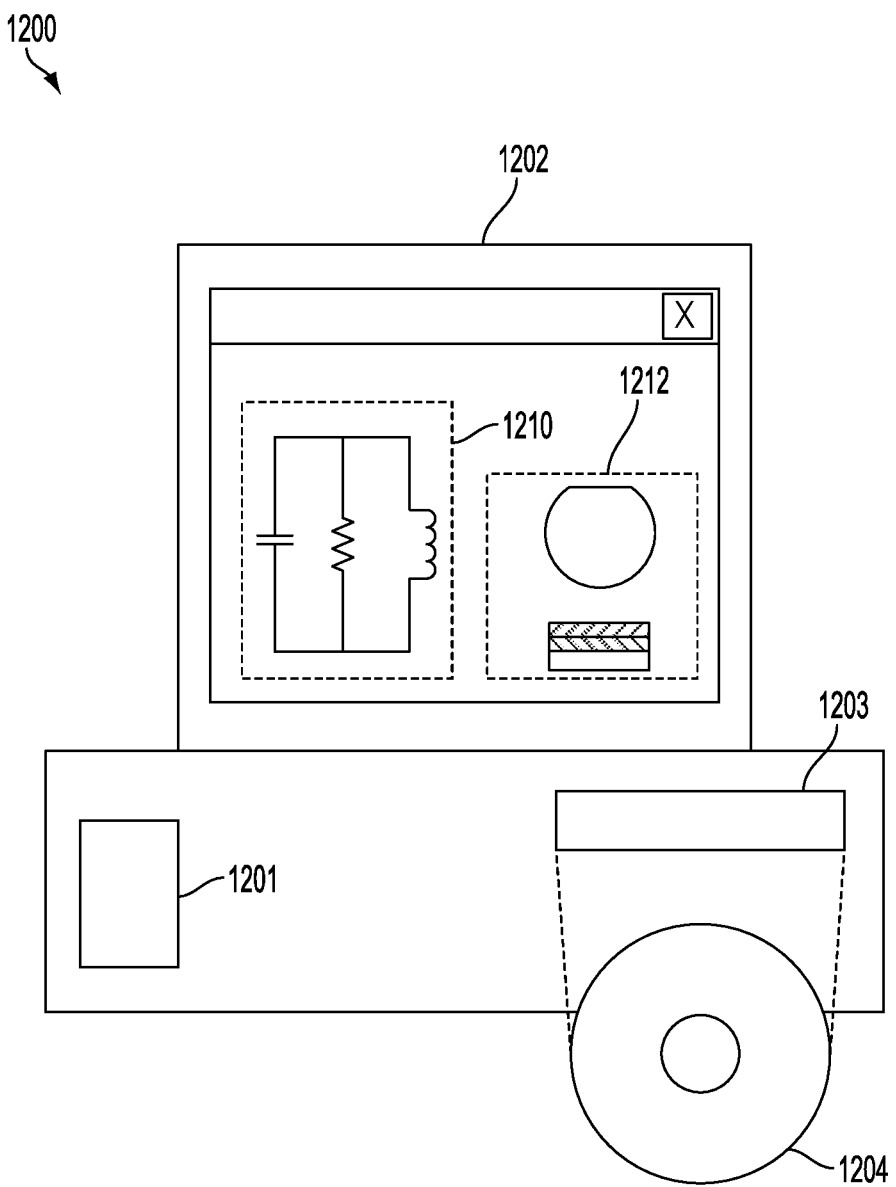
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the integrated circuit devices disclosed above. A design workstation 1200 includes a hard disk 1201 containing operating system software, support files, and design software such as Cadence or OrCAD. The design workstation 1200 also includes a display 1202 to facilitate design of a circuit 1210 or a semiconductor component 1212 such as the integrated circuit devices. A storage medium 1204 is provided for tangibly storing the circuit design 1210 or the semiconductor component 1212. The circuit design 1210 or the semiconductor component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit design 1210 or the semiconductor component 1212 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit device comprising:
    a portion of a support carrier;
    an isolation layer on the portion of the support carrier;
    an SOI layer (silicon on insulator layer), comprising a first SOI region and a second SOI region on the isolation layer;
    a first active device, comprising the first SOI region, including a first semiconductor well layer of a first semiconductor well thickness in a first portion of the isolation layer having a first isolation layer thickness; and
    a second active device, comprising the second SOI region, including a second semiconductor well layer of a second semiconductor well thickness in a second portion of the isolation layer having a second isolation layer thickness, the portion of the support carrier bonded to a planar surface of the isolation layer opposite a surface of the isolation layer supporting the first active device and the second active device, the second semiconductor well thickness differing from the first semiconductor well thickness, and the second isolation layer thickness differing from the first isolation layer thickness.

2. The integrated circuit device of claim 1, in which the first active device and the second active device are on a same level.

3. The integrated circuit device of claim 1, in which the first active device comprises a doped semiconductor well region that contacts a gate dielectric.

4. The integrated circuit device of claim 1, in which the second active device comprises an embedded silicon germanium layer.

5. The integrated circuit device of claim 1, further comprising a front side back-end-of-line (BEOL) layer distal from the portion of the support carrier.

6. The integrated circuit device of claim 1, further comprising a back side back-end-of-line (BEOL) layer in a backside dielectric layer.

7. A method of making an integrated circuit device comprising:
fabricating an SOI layer (silicon on insulator layer), including a first SOI region and a second SOI region on an isolation layer;
fabricating a first active device, comprising the first SOI region, including a first semiconductor well layer of a first semiconductor well thickness in a first portion of the isolation layer having a first isolation layer thickness;
fabricating a second active device, comprising the second SOI region, including a second semiconductor well layer of a second semiconductor well thickness in a second portion of the isolation layer having a second isolation layer thickness, the second semiconductor well thickness differing from the first semiconductor well thickness, and the second isolation layer thickness differing from the first isolation layer thickness; and
bonding a portion of a support carrier to a planar surface of the isolation layer opposite a surface of the isolation layer supporting the first active device and the second active device.

8. The method of making the integrated circuit device of claim 7, in which fabricating the SOI layer comprises fabricating the second SOI region of the SOI layer with the second semiconductor well thickness and the method further comprises:
forming a trench insulation region within the SOI layer to separate the first SOI region corresponding to the first active device and the second SOI region corresponding to the second active device; and
fabricating the first active device and the second active device.

9. The method of making the integrated circuit device of claim 8, further comprising removing portions of the SOI layer within the first SOI region until an insulation material of the trench insulation region is sensed, the removing reducing the first active device to the first semiconductor well thickness.

10. A method of making an integrated circuit device, comprising:
fabricating a portion of a support carrier;
fabricating an SOI layer (silicon on insulator layer);
fabricating a first active device having a first semiconductor thickness in a dielectric layer, the first active device on the SOI layer;
fabricating a second active device having a second semiconductor thickness in the dielectric layer, the portion of the support carrier supporting the first active device and the second active device, the second active device on the SOI layer, the second semiconductor thickness differing from the first semiconductor thickness;
masking a region of the SOI layer having a starting thickness that is the same as the second semiconductor thickness, the second semiconductor thickness being thicker than the first semiconductor thickness;
opening a region of the SOI layer allocated for fabricating the first active device;
performing thermal oxidation to consume silicon of the SOI layer up to the first semiconductor thickness; and
removing the masking from the region of the SOI layer having a starting thickness the same as the second semiconductor thickness.

11. The method of making the integrated circuit device of claim 10, in which fabricating the first active device and the second active device comprises:
selectively performing epitaxy on the SOI layer starting with a thin SOI layer having the first semiconductor thickness to form a second region of the SOI layer with the second semiconductor thickness proximate a first region of the SOI layer with the first semiconductor thickness; and
depositing the dielectric layer on the first region and the second region.

12. A method of making an integrated circuit device, comprising:
fabricating a portion of a support carrier;
fabricating an SOI layer (silicon on insulator layer);
fabricating a first active device having a first semiconductor thickness in a dielectric layer, the first active device on the SOI layer;
fabricating a second active device having a second semiconductor thickness in the dielectric layer, the portion of the support carrier supporting the first active device and the second active device, the second active device on the SOI layer, the second semiconductor thickness differing from the first semiconductor thickness;
fabricating a radio frequency enhancement layer between the SOI layer;
forming trench insulation regions within the SOI layer to separate a first region corresponding to the first active device and a second region corresponding to the second active device; and
fabricating the first active device and the second active device.

13. The method of making the integrated circuit device of claim 12, further comprising removing portions of the SOI layer within the first region up to the radio frequency enhancement layer, wherein the removing reduces the first active device to the first semiconductor thickness.

14. The method of making the integrated circuit device of claim 13, further comprising masking the second region when removing the portions of the SOI layer within the first region.

15. An integrated circuit device comprising:
a portion of a support carrier;
an isolation layer on the portion of the support carrier;
an SOI layer (silicon on insulator layer), comprising a first SOI region and a second SOI region on the isolation layer;
first means for controlling electron flow, comprising the first SOI region, including a first semiconductor well layer of a first semiconductor well thickness in a first portion of the isolation layer having a first isolation layer thickness; and
second means for controlling electron flow, comprising the second SOI region, including a second semiconductor well layer of a second semiconductor well thickness in a second portion of the isolation layer having a second isolation layer thickness, the portion of the support carrier bonded to a planar surface of the isolation layer opposite a surface of the isolation layer supporting the first electron flow control means and the second electron flow control means, the second semiconductor well thickness differing from the first semiconductor well thickness, and the second isolation layer thickness differing from the first isolation layer thickness.

16. The integrated circuit device of claim 15, in which the first electron flow control means and the second electron flow control means are on a same level.

17. The integrated circuit device of claim 15, further comprising a front side back-end-of-line (BEOL) layer distal from the portion of the support carrier.

18. The integrated circuit device of claim 15, further comprising a back side back-end-of-line (BEOL) layer in a backside dielectric layer.

\* \* \* \* \*